United States Patent
Tomishima

[19]

[11] Patent Number: 5,909,141
[45] Date of Patent: Jun. 1, 1999

[54] STEP-UP POTENTIAL SUPPLY CIRCUIT AND SEMICONDUCTOR STORAGE DEVICE

[75] Inventor: Shigeki Tomishima, Tokyo, Japan

[73] Assignee: Mitsubishi Denki Kabushiki Kaisha, Tokyo, Japan

[21] Appl. No.: 08/874,351

[22] Filed: Jun. 13, 1997

[30] Foreign Application Priority Data

Mar. 3, 1997 [JP] Japan ................................. 9-047909

[51] Int. Cl.$^6$ ....................................................... G05F 1/10
[52] U.S. Cl. ........................................... 327/536; 327/534
[58] Field of Search ..................................... 307/109, 110; 327/534, 535, 536

[56] References Cited

U.S. PATENT DOCUMENTS

| | | | |
|---|---|---|---|
| 5,602,794 | 2/1997 | Javanifard et al. ...................... | 365/226 |
| 5,767,735 | 6/1998 | Javanifard et al. ...................... | 327/536 |

FOREIGN PATENT DOCUMENTS

| | | |
|---|---|---|
| 64-45157 | 2/1989 | Japan . |
| 3-152791 | 6/1991 | Japan . |
| 5-189961 | 7/1993 | Japan . |

*Primary Examiner*—Timothy P. Callahan
*Assistant Examiner*—Jeffrey Zweizig
*Attorney, Agent, or Firm*—Oblon, Spivak, McClelland, Maier & Neustadt, P.C.

[57] ABSTRACT

An object is to obtain a step-up potential supply circuit which can supply a suitable step-up potential with suppressed power consumption even with a power-supply potential varying in a relatively large range. A 2Vcc charge pump circuit (1) is always kept in an active state. A power-supply potential detecting circuit (4) detects a power-supply potential Vcc. When the power-supply potential Vcc is under a first comparison potential, a switching signal SS at "L" is outputted to turn on a switch portion (3). Then a 2Vcc charge pump circuit (2) enters an active state and a step-up potential Vpp is supplied with a relatively large first charge supply capability. When the power-supply potential Vcc is above the first comparison potential, the switching signal SS is outputted at "H" to turn off the switch portion (3). Then the 2Vcc charge pump circuit enters an inactive state and the step-up potential Vpp is supplied with a relatively small second charge supply capability.

10 Claims, 17 Drawing Sheets

STEP-UP POTENTIAL SUPPLY CIRCUIT AND SEMICONDUCTOR STORAGE DEVICE

BACKGROUND OF THE INVENTION

1. Field of the Invention

The present invention relates to semiconductor devices, and particularly to a step-up potential supply circuit for use in a semiconductor storage device such as a dynamic random access memory.

2. Description of the Background Art

FIG. 13 is a block diagram showing the overall circuit structure of a conventional DRAM. As shown in this diagram, an address signal inputted from an external address pin P1 passes the address buffer 21 and is time-divided; the row address is inputted to the row decoder 22 and the column address to the column decoder 23. The row decoder 22 decodes the row address, according to which result the word driver 24 selectively activates a word line WL in the memory cell array 25. The memory array 25 includes DRAM memory cells arranged in a matrix, where each row is connected to a common word line WL and each column is connected to a common bit line BL.

The column decoder 23 decodes the column address, according to which result a bit line, or a column selecting line, is selected. Then, when reading, data in the memory cell connected to both of the selected word line and bit line is amplified in the sense amplifier 26 and then outputted from the output pin P0 through a preamplifier (not shown) and the output buffer 27.

FIG. 14 shows the structure of a memory cell of the DRAM in detail. A memory cell of the DRAM is formed of one NMOS transistor 215 and one capacitor 217. The NMOS transistor 215 has its gate connected to the word line WL, one of its source/drain connected to the bit line BL and the other connected to one electrode of the capacitor 217. The substrate potential of the semiconductor substrate in which this NMOS transistor 215 is formed is (when a p-type substrate is used) usually at a negative, back gate potential (Vbb). The other electrode of the capacitor is set at a cell-plate potential Vcp.

The operation of writing "H" data (a Vcc level) into the memory cell is explained referring to FIG. 15. A Vcc level is transferred to the bit line BL by the sense amplifier 26 (refer to FIG. 13). Then, the word line WL is caused to rise to write Vcc into the storage node SN of the capacitor.

FIG. 16 shows the conditions of the voltage applied to the NMOS transistor at this time. When the bit line BL (source) attains the Vcc level, a large back gate potential Vbs (Vbb−Vcc) is applied to it due to the substrate potential Vbb. Originally, the NMOS transistor 215 of the memory cell has a higher threshold (Vth) than usual peripheral NMOS transistors to reduce the sub-threshold leakage current and to improve the refresh characteristics.

Then, when the source potential on the bit line BL rises to the Vcc level and the back gate voltage Vbs increases, the threshold of the NMOS transistor 215 of the memory cell further increases. FIG. 17 is a graph showing the increase of the threshold of the transistor of the memory cell due to the substrate effect. As shown in this diagram, while the threshold of the NMOS transistor 215 is Vt1 with Vbs=Vbb, it becomes as high as Vt2 when the Vcc level is written into the capacitor 217.

The "H" level of the word line WL must strongly turn on the NMOS transistor 215 to certainly transfer the Vcc level to the memory cell. The "H" level of the word line therefore requires the level of Vcc+Vth plus operation margin α; (Vcc+Vth+α).

FIG. 18 shows the relation between the word line WL and the power-supply potential Vcc. Since the threshold of the memory cell does not fall in proportion to the Vcc level, that is, since it takes almost the same value, the potential on the word line WL is proportional to Vcc. Nowadays, a power-supply for the step-up potential Vpp is usually used to set the potential on the word line WL. FIG. 19 and FIG. 20 show examples of circuit structure of a word driver.

In FIG. 19, the NAND gate 33 receives the row address and outputs the decoded result (select with "L" and unselect with "H") to the word driver 24. The word driver 24 is formed of PMOS transistors 34 and 35 and an NMOS transistor 36. The sources of the PMOS transistors 34 and 35 receive the step-up potential Vpp, and the PMOS transistor 35 and the NMOS transistor 36 form a CMOS inverter. The output portion of this CMOS inverter is connected to the word line WL and to the gate of the PMOS transistor 34. The input portion of the CMOS inverter and the drain of the PMOS transistor 34 receive the output of the NAND gate 33.

With this structure, when the output of the NAND gate 33 is "L", the PMOS transistor 35 turns on and the NMOS transistor 36 turns off, and therefore the word line WL is provided with the step-up potential Vpp. On the other hand, when the output of the NAND gate 33 is "H", the PMOS transistor 35 turns off and the NMOS transistor 36 turns on, and then the word line WL is set at an "L" level (the ground level). Furthermore, the PMOS transistor 34 turns on and the step-up potential Vpp is applied to the input portion of the CMOS inverter, and then the PMOS transistor 35 certainly turns off.

In FIG. 20, the inverter 37 receives the output from the NAND gate 33 and the output of the inverter 37 (the "H" level is the step-up potential Vpp) is applied to the gate of the NMOS transistor 39 through the NMOS transistor 38. The NMOS transistors 39 and 40 are connected in series between the signal RX and the ground level, the signal RX supplying the step-up potential Vpp.

With this structure, when the output of the NAND gate 33 is "L", the output of the inverter 37 is "H" (the step-up potential Vpp), and then the NMOS transistor 39 turns on and the NMOS transistor 40 turns off. Then, the word line WL is provided with the step-up potential Vpp. On the other hand, when the NAND gate 33 is "H", the NMOS transistor 39 turns off and the NMOS transistor 40 turns on, and then the word line WL is set at the "L" level (the ground level).

FIG. 21 is a circuit diagram showing the basic principle of a conventional Vpp generating circuit. The precharge circuit 41 (shown as a power-supply and a diode in FIG. 21) precharges the node NA to the Vcc level. The pump capacitor 42 is connected to the node NA, one electrode of which is thus charged. After the precharging, the oscillator 44 applies an oscillation signal (amplitude of GND and Vcc) to the other electrode of the capacitor 42. Then, the node NA is stepped up from the Vcc level to the doubled Vcc level, which potential is transferred to the step-up potential node Npp. FIG. 21 shows the diode 43 as a switch element for passing the potential to the step-up potential node Npp.

FIG. 22 shows an example of a charge pump circuit. A pulse-like clock signal CLK is inputted. The signal CLK is applied to one electrode of the capacitor 65 and one electrode of the capacitor 66. The node NA on the other electrode side of the capacitor 67 is connected to the drain of the NMOS transistor 73 and the node NB on the other electrode side of the capacitor 65 is connected to the gate of the NMOS transistor 73. The NMOS transistor 69, having common drain and gate, is interposed between the power-supply potential Vcc and the node NA, and the NMOS transistor 71, having common drain and gate, is interposed between the power-supply potential Vcc and the node NB.

With this structure, before starting operation, the nodes NA and NB are precharged by the NMOS transistors 69 and 71 to the power-supply potential Vcc, or to a potential at a level lower than the power-supply potential Vcc by the threshold voltage. When starting operation, the clock signal CLK is inputted to the capacitors 65 and 67. Then, as the clock signal CLK rises from the ground level (0V) to the power-supply potential Vcc, the potentials at the nodes NA and NB rise from the power-supply potential Vcc level to the doubled, 2Vcc level because of the capacitive coupling of the capacitors 67 and 65. The potential at the 2Vcc level at the node NA is supplied to the step-up potential node Npp as the step-up potential Vpp through the NMOS transistor 73. However, supplied to the step-up potential node Npp is a potential lower than 2Vcc by the threshold voltage of the NMOS transistor 73, because the last driver of the charge pump circuit is the NMOS transistor 73.

Next, FIG. 23 shows a circuit using a triple-well structure. As shown in FIG. 23, a pulse-like clock signal CLK is inputted. The signal CLK is applied to one electrode of the capacitor 45 and to one electrode of the capacitor 46. The node NA on the other electrode side of the capacitor 45 is connected to the drain of the NMOS transistor 47 and the node NB on the other electrode side of the capacitor 46 is connected to the gate of the NMOS transistor 47.

As shown in the section in FIG. 24, since the drain of the NMOS transistor 47 is electrically connected to the P-well region 231, the island in which the NMOS transistor 47 is formed, a potential is transferred by the PN junction from the P-well region 231 to the N$^+$ region 232, or the source of the NMOS transistor 47.

While it is hence possible to cause the step-up potential Vpp to be outputted from the step-up potential node Npp with operation similar to that of the charge pump circuit shown in FIG. 22, the step-up potential Vpp is lower than the doubled Vcc level by the PN junction voltage Vv. However, as the PN junction voltage Vv is lower than the threshold of the NMOS transistor, the charge pump circuit shown in FIG. 23 can generate the step-up potential Vpp at a higher level than the charge pump circuit shown in FIG. 22.

FIG. 25 is a circuit diagram showing an example of a charge pump circuit in detail. As shown in this diagram, the charge pump circuit is formed of capacitors 75 and 77, a level converting circuit 79, and an NMOS transistor 81.

The capacitor 75 is interposed between the node to which the clock signal CLK is inputted and the node NA. The level converting circuit 79 enlarges the amplitude of the clock signal CLK and outputs it to the capacitor 77. The capacitor 77 is interposed between the level converting circuit 79 and the node NB. The NMOS transistor 81 is interposed between the node NA and the step-up potential node Npp, the gate of the NMOS transistor 81 serving as the node NB.

This structure, that is, providing the gate of the NMOS transistor 81 with a potential level higher than the potential level (2Vcc level) inputted to the gate of the NMOS transistor 73 of FIG. 22 prevents the potential supplied from the node NA to the step-up potential node Npp from being lowered from 2Vcc by the threshold voltage of the NMOS transistor 81.

FIG. 26 is a circuit diagram showing the level converting circuit 79 of FIG. 25 in detail. The same parts as those in FIG. 25 are shown at the same reference characters and not fully described again.

Referring to FIG. 26, the level converting circuit 79 is formed of NMOS transistors 83, 85, PMOS transistors 87, 89 and an inverter 91. The PMOS transistor 87 and the NMOS transistor 83 are connected in series between the step-up potential Vpp and the ground level. The PMOS transistor 89 and the NMOS transistor 85 are connected in series between the step-up potential Vpp and the ground level. The clock signal CLK as an input signal IN is applied to the gate of the NMOS transistor 83. The clock signal CLK is inverted by the inverter 91 and inputted to the gate of the NMOS transistor 85. The PMOS transistor 89 has its gate connected to the drain of the NMOS transistor 83 and the PMOS transistor 87 has its gate connected to the drain of the NMOS transistor 85. An output signal OUT is outputted from the drain of the NMOS transistor 85 to the capacitor 77 of FIG. 25.

Referring to FIG. 25 and FIG. 26, operation of the charge pump circuit will be explained. When the clock signal CLK at the ground level is inputted to the level converting circuit 79, the level converting circuit 79 outputs the signal OUT on the ground level to the capacitor 77. Next, when the clock signal CLK goes from the ground potential GND level to the power-supply potential Vcc, the level converting circuit 79 outputs the signal OUT at the step-up potential Vpp level to the capacitor 77. That is to say, the capacitor 77 is provided with the step-up potential Vpp, and then the potential at the node NB becomes higher than 2Vcc because of the capacitive coupling. This allows the potential at the 2Vcc level at the node NA to be transferred to the step-up potential node Npp as the step-up potential Vpp without affected by the threshold voltage of the NMOS transistor 81. That is to say, the potential transferred to the step-up potential node Npp is not lowered from 2Vcc by the threshold voltage of the NMOS transistor 81.

FIG. 27 is a circuit diagram showing another example of a charge pump circuit in detail. Referring to FIG. 27, the charge pump circuit is formed of an inverter 93, diodes 95 and 97, NMOS transistors 99, 101, a PMOS transistor 103 and capacitors 105, 107 and 109.

The capacitor 107 is connected between the node to which the clock signal CLK is inputted and the node NC. The NMOS transistor 101 is connected between the node NC and the step-up potential node Npp, whose gate is connected to the node NB. The input node of the inverter 93 is connected to the input node for the clock signal CLK and its output node is connected to the gate of the PMOS transistor 103 and the gate of the NMOS transistor 99. The diode 95, the PMOS transistor 103 and the NMOS transistor 99 are connected in series between the power-supply potential Vcc and the ground level. The capacitor 105 is interposed between the input node for the clock signal CLK and the node NA. The capacitor 109 is interposed between the drain of the NMOS transistor 99 and the node NB. The diode 97 is interposed between the power-supply potential Vcc and the node NB.

FIG. 28 is a timing diagram for describing operation of the charge pump circuit of FIG. 27. Referring to FIG. 27 and FIG. 28, the operation of the charge pump circuit will be explained. The node NA is charged to the power-supply potential Vcc by the diode 95 as a precharge circuit. When the clock signal CLK goes from 0V to the power-supply potential Vcc, the capacitive coupling causes the potential at the node NA to become the 2Vcc level twice as large as the power-supply potential Vcc. On the other hand, a potential of 0V is applied to the gate of the PMOS transistor 103 and it turns on. Accordingly, the potential at the 2Vcc level is provided to the capacitor 109 from the node NA. The operation explained so far corresponds to the operation of enlarging the amplitude of the clock signal CLK from between the ground level (0V) and the power-supply potential Vcc to between the ground level (0V) and 2Vcc. Since the capacitor 109 is thus provided with a potential at the 2Vcc level, the potential at the node NB is stepped up from the power-supply potential Vcc level to the triple, 3Vcc level. Accordingly, the potential at the 2Vcc level at the node NC produced by the capacitor 107 is intactly transferred to the step-up potential node Npp by the NMOS transistor 101 receiving the 3Vcc potential at its gate without being decreased the threshold voltage of the NMOS transistor 101.

FIG. 29 shows an example of utilization of the Vpp power-supply. The step-up potential Vpp produced by the charge pump circuit explained above is used as an operation power-supply for circuits requiring the step-up potential Vpp, such as the word driver 24, the RX driver 18, etc. When the DRAM enters a running state, the step-up potential Vpp generated from the charge pump circuit is consumed and its potential decreases. When the step-up potential Vpp remains decreased, the potential on a word line WL in an active state will not rise sufficiently, or it will take long before attaining a desired potential, leading to deterioration of performance or malfunction of the DRAM.

If the charge pump circuit is always kept operating to maintain the step-up potential Vpp at a desired level, however, the power consumption increases. Then, the circuit shown in FIG. 30 is suggested. As shown in FIG. 30, a detecting circuit 19 is provided to detect whether the step-up potential Vpp is maintaining a certain level. When the step-up potential Vpp falls below the certain level, it provides a pump active signal $\overline{OE}$ at "L" to cause the ring oscillator 20 to operate. Then the charge pump circuit 28 generates the step-up potential Vpp at the step-up potential node Npp in response to the clock signal CLK from the ring oscillator 20. On the other hand, when the potential level at the step-up potential node Npp attains or exceeds the certain level, the detecting circuit 19 provides the pump active signal $\overline{OE}$ at "H" to stop the operation of the ring oscillator 20. The charge pump circuit 28 then stops generating the step-up potential Vpp to the step-up potential node Npp.

FIG. 31 and FIG. 32 are circuit diagrams showing examples of structure of the detecting circuit 19. In FIG. 31, an NMOS transistor 111 and a resistor 115 are connected in series between the step-up potential node Npp and the ground level and the power-supply potential Vcc is applied to the gate of the NMOS transistor 111. The NMOS transistor 111 has a channel length larger than usual to realize a threshold Vth similar to that of the transistor forming a memory cell (the NMOS transistor 215 in FIG. 13). The signal obtained from the node NO between the NMOS transistor 111 and the resistor 115 becomes the pump active signal $\overline{OE}$.

Accordingly, in the circuit in FIG. 31, the pump active signal $\overline{OE}$ goes "H" when the step-up potential Vpp exceeds (Vcc+Vth) and goes "L" when it falls below it.

In FIG. 32, the detecting circuit 19 is formed of PMOS transistors 117, 119 and a resistor 121. The PMOS transistor 117, the PMOS transistor 119 and the resistor 121 are connected in series between the step-up potential node Npp and the ground level. The PMOS transistor 117 is diode-connected and the gate of the PMOS transistor 119 is provided with the power-supply potential Vcc. The threshold voltage of the PMOS transistors 117 and 119 is taken to be Vthp. The signal obtained from the node NO between the drain of the PMOS transistor 119 and the resistor 121 becomes the pump active signal $\overline{OE}$.

Hence, in the circuit shown in FIG. 32, the pump active signal $\overline{OE}$ goes "H" when the step-up potential Vpp exceeds (Vcc+2Vthp) and goes "L" when it falls below it.

Thus, in the detecting circuits 19 having the structures shown in FIG. 31 and FIG. 32, when the charge is consumed from the step-up potential node Npp and the step-up potential Vpp drops, the transistor 111 (119) turns off and the pump active signal $\overline{OE}$ goes "L" to cause the charge pump circuit to operate to maintain the step-up potential Vpp above a set value.

Consider DRAM operation at a power-supply potential Vcc as low as 2V, or lower. When the step-up potential Vpp is generated by using the charge pump circuit having the structure described above, the capability (the maximum attainable level) of the charge pump circuit can, even if an ideal circuit, attain only the doubled power-supply potential Vcc. That is to say, the step-up potential Vpp has an inclination twice that of a change in the power-supply potential Vcc. However, the threshold (Vth) of the memory cells can not be lowered in proportion to Vcc, since the refresh characteristics must be maintained.

In FIG. 33, the line Ld shows a change of the power-supply potential Vcc. That is to say, the vertical axis in FIG. 33 shows the power-supply potential Vcc for the line Ld. The threshold voltage Vth of the NMOS transistor 215 (FIG. 2) of a memory cell can not be lowered at the same inclination as the power-supply potential Vcc. That is to say, the threshold voltage Vth has almost the same value irrespective of the power-supply potential Vcc. Accordingly, the minimum potential level required for the step-up potential Vpp has approximately the same inclination as the power-supply potential Vcc. The line Lc shows the minimum potential level required for the step-up potential Vpp.

In practice, the minimum potential level required for the step-up potential Vpp further includes, in addition to the value (Vcc+Vth), the operation margin m2 (hundreds of millivolts) and the control margin m1 (hundreds of millivolts) for controlling the detecting circuit 19 (FIG. 30). The line Lb shows the minimum potential level actually required for the step-up potential Vpp. The threshold voltage Vth of the NMOS transistor forming a memory cell can not be lowered at approximately the same inclination as the power-supply potential Vcc because it is necessary to maintain the refresh characteristics and the control margin m1 is required to prevent the charge pump circuit 28 (FIG. 30) from operating too frequently to increase the power consumption. In summary, the actually required minimum potential level for the step-up potential Vpp is (Vcc+Vth+m1+m2; the line Lb in FIG. 33).

The maximum step-up potential Vpp that a step-up potential generating circuit can generate rapidly decreases as the power-supply potential Vcc decreases. The line La in FIG. 33 shows the potential level of the maximum step-up potential Vpp that the step-up potential generating circuit can generate.

This rapid decrease is due to the fact that the maximum step-up potential Vpp that the step-up potential generating circuit can generate has an inclination twice that of the power-supply potential Vcc, since the maximum step-up potential Vpp that the step-up potential generating circuit can generate is at the 2Vcc level.

In FIG. 33, when the power-supply potential Vcc is Vb (about 3.3 V), that is, when the power-supply potential Vcc is relatively large, there is no problem because the maximum step-up potential Vpp (the line La) that the step-up potential generating circuit can generate sufficiently exceeds the actually required step-up potential Vpp (the line Lb).

A problem arises, however, when the power-supply potential Vcc is Va (about 1.5V) or lower, that is, when the power-supply potential Vcc is as small as 2V, or smaller. That is to say, when the power-supply potential Vcc is Va, the maximum step-up potential Vpp (the line La) that the step-up potential generating circuit can generate is almost equal to the actually required minimum step-up potential Vpp (the line Lb). When the power-supply potential Vcc is lower than Va, the maximum step-up potential Vpp that the step-up potential generating circuit can generate becomes smaller than the actually required minimum step-up potential Vpp. Thus there is the problem that the conventional step-up potential generating circuit can not supply the actually required step-up potential Vpp if the power-supply potential Vcc is small.

FIG. 34 is a circuit diagram showing a power-supply for supplying the step-up potential Vpp, which is used to explain another problem of the conventional DRAM. The same parts as those in FIG. 21 are shown at the same reference characters and not fully explained. The switch 49 in FIG. 34 corresponds to the diode 43 in FIG. 21.

Referring to FIG. 34, when the capacitance value of the negative side capacitor 48 is taken as Cv, the capacitor 48 accumulates a charge of (Cv·Vpp). In this sense, the step-up potential node Npp to which the capacitor 48 is connected can be regarded as a power-supply for supplying the step-up potential Vpp.

In one operating period (in one cycle), the power-supply Npp consumes a certain fixed amount of charge, that is, (Cv·Vpp). Hence, if the consumed charge is not compensated for in one cycle in the direction of the arrow 'a' from the step-up potential generating circuit, the step-up potential Vpp may fall below the certain potential when the next cycle starts, which may lead to a malfunction.

When the capacitor (pump capacitor) 42 has a capacitance of Cp, the amount of charge which can be supplied from the step-up potential generating circuit is Cp·(2Vcc−Vpp). If the (2Vcc−Vpp) has a small value, that it, if the difference between the maximum step-up potential that the step-up potential generating circuit can generate and the minimum required potential for the step-up potential is small, it is necessary to set a large value for the capacitor (pump capacitor) 42. This causes the problem of an increase in chip size.

Since a charge pump circuit for the step-up potential Vpp having an attainable level of doubled Vcc is not sufficient when operating with a low power-supply potential, use of a pump circuit providing a value larger than the twice will be one of the solutions. Such a pump circuit structure is described in detail in Japanese Patent Laying-Open No. 7-46825. For the object of realizing a DRAM with a wide range of power-supply potential, generating a Vpp larger than the doubled Vcc works with a low power-supply potential Vcc. However, with a high Vcc, in addition to the fact that the level larger than the doubled Vcc is unnecessary, the large capacitance of the pump capacitor in the charge pump circuit will supply excessive charge to excessively raise the step-up potential Vpp, bringing about new problems like deterioration of reliability and increase in the power consumption.

SUMMARY OF THE INVENTION

According to a first aspect of the present invention, a step-up potential supply circuit for supplying a step-up potential from a step-up potential node comprises: power-supply potential detecting means for detecting a power-supply potential to output a control signal on the basis of the detected power-supply potential; and step-up potential generating means for stepping up the power-supply potential to generate the step-up potential at the step-up potential node; wherein the step-up potential generating means generates the step-up potential with a charge supply capability determined on the basis of the control signal.

Preferably, according to a second aspect, in the step-up potential supply circuit, the control signal at least includes information indicating a first state in which the power-supply potential is lower than a first comparison potential or a second state in which the power-supply potential is higher than the first comparison potential, and the step-up potential generating means generates the step-up potential with a relatively large, first charge supply capability when the control signal indicates the first state and generates the step-up potential with a relatively small, second charge supply capability when the control signal indicates the second state.

Preferably, according to a third aspect, in the step-up potential supply circuit, the step-up potential generating means comprises first charge pump means for, in an active state, stepping up the power-supply potential to generate the step-up potential at the step-up potential node with a first partial charge supply capability, and second charge pump means for, in an active state, stepping up the power-supply potential to generate the step-up potential at the step-up potential node with a second partial charge supply capability, wherein the first charge pump means is always in the active state and the second charge pump means enters the active state when the control signal indicates the first state and enters an inactive state when the control signal indicates the second state.

Preferably, according to a fourth aspect, in the step-up potential supply circuit, the step-up potential includes a potential approximately twice the power-supply potential in magnitude.

Preferably, according to a fifth aspect, in the step-up potential supply circuit, the step-up potential includes a potential approximately three times the power-supply potential in magnitude.

Preferably, according to a sixth aspect, in the step-up potential supply circuit, the control signal at least includes information indicating a first state in which the power-supply potential is lower than a first comparison potential, or a second state in which the power-supply potential is higher than the first comparison potential and lower than a second comparison potential, or a third state in which the power-supply potential is higher than the second comparison potential, and the step-up potential generating means generates the step-up potential with a relatively large, first charge supply capability when the control signal indicates the first state, generates the step-up potential with a relatively small, second charge supply capability when the control signal indicates the second state, and generates the step-up potential with a third charge supply capability sufficiently smaller than the second charge supply capability when the control signal indicates the third state.

Preferably, according to a seventh aspect, in the step-up potential supply circuit, the step-up potential generating means comprises first charge pump means for, in an active state, stepping up the power-supply potential to generate the step-up potential at the step-up potential node with a first partial charge supply capability, second charge pump means for, in an active state, stepping up the power-supply potential to generate the step-up potential at the step-up potential node with a second partial charge supply capability, and third charge pump means for, in an active state, stepping up the power-supply potential to generate the step-up potential at the step-up potential node with a third partial charge supply capability, wherein the first charge pump means is always in the active state, the second charge pump means enters the active state when the control signal indicates the first state and enters an inactive state when the control signal indicates the second state or the third state, and the third charge pump means enters the active state when the control signal indicates the first state or the second state and enters an inactive state when the control signal indicates the third state.

Preferably, according to an eighth aspect, in the step-up potential supply circuit, the control signal includes first and second partial control signals, and the power-supply potential detecting means comprises first partial power-supply potential detecting means for outputting, to the second charge pump means, the first partial control signal indicating the first state in which the power-supply potential is lower than the first comparison potential, or the second state or the third state in which the power-supply potential is higher than the first comparison potential, on the basis of the power-supply potential, and second partial power-supply potential detecting means for outputting, to the third charge pump means, the second partial control signal indicating the first state or the second state in which the power-supply potential is lower than the second comparison potential, or the third state in which the power-supply potential is higher than the second comparison potential, on the basis of the power-supply potential.

The present invention is also directed to a semiconductor storage device. According to a ninth aspect of the present invention, the semiconductor storage device comprises: a step-up potential supply circuit for supplying a step-up potential from a set-up potential node; an internal circuit connected to the step-up potential node for operating with the step-up potential as an operation power-supply potential; and a memory cell array which is access-enabled by operation of the internal circuit, wherein the step-up potential supply circuit comprises, power-supply potential detecting means for detecting a power-supply potential to output a control signal on the basis of the detected power-supply potential; and step-up potential generating means for stepping up the power-supply potential to generate the step-up potential at the step-up potential node; wherein the step-up potential generating means generates the step-up potential with a charge supply capability determined on the basis of the control signal.

Preferably, according to a tenth aspect, in the semiconductor storage device, the memory cell array comprises a plurality of dynamic-type memory cells, and the internal circuit includes a memory cell selecting line control circuit having a memory cell selecting line for selecting a certain number of memory cells in the plurality of memory cells, for setting the memory cell selecting line at the step-up potential in a selected state.

In the step-up potential supply circuit according to the first aspect of the present invention, the power-supply potential detecting means outputs a control signal on the basis of the detected power-supply potential and the step-up potential generating means generates the step-up potential with a charge supply capability determined on the basis of the control signal. Accordingly, it is possible to supply the step-up potential from the step-up potential node with a suitable charge supply capability according to variation in the power-supply potential.

In the step-up potential supply circuit of the second aspect, the step-up potential generating means generates the step-up potential with a relatively large, first charge supply capability when the control signal indicates a first state (the power-supply potential is lower than a first comparison potential) and generates the step-up potential with a relatively small, second charge supply capability when the control signal indicates a second state (the power-supply potential is higher than the first comparison potential).

Accordingly, when the difference between the power-supply potential and the step-up potential is so small that generation of the step-up potential at a maximum level is required, the step-up potential is generated with the relatively large, first charge supply capability so that the step-up potential can be supplied without potential reduction, and when the difference between the power-supply potential and the step-up potential is so large that the step-up potential has an allowance, the step-up potential is generated with the relatively small, second charge supply capability with suppressed power consumption.

This provides a step-up potential supply circuit which can supply the step-up potential at a suitable level with suppressed power consumption.

The step-up potential generating means of the step-up potential supply circuit of the third aspect has first and second charge pump means: the first charge pump means is always in an active state and the second charge pump means enters an active state when the control signal indicates the first state and enters an inactive state when the control signal indicates the second state.

Consequently, when the power-supply potential is in the first state, the second charge pump circuit is forced to an active state to realize the relatively large, first charge supply capability corresponding to the sum of a first partial charge supply capability and a second partial charge supply capability, and when the power-supply potential is in the second state, the second charge pump circuit is forced to an inactive state to realize the relatively small, second charge supply capability only with the first partial charge supply capability.

In the step-up potential supply circuit of the fourth aspect, the step-up potential includes a potential approximately twice as large as the power-supply potential. Accordingly, a step-up potential approximately twice the power-supply potential can be certainly supplied when the power-supply potential is in the first state.

In the step-up potential supply circuit of the fifth aspect, the step-up potential includes a potential approximately three times as large as the power-supply potential. Accordingly, a step-up potential approximately three times the power-supply potential can be certainly supplied when the power-supply potential is in the first state.

In the step-up potential supply circuit of the sixth aspect, the step-up potential generating means generates the step-up potential with a relatively large, first charge supply capability when the control signal indicates a first state (the power-supply potential is lower than a first comparison potential), generates the step-up potential with a relatively small, second charge supply capability when the power-supply potential indicates a second state (the power-supply potential is higher than a first comparison potential and lower than a second comparison potential), and generates the step-up potential with a third charge supply capability lower than the second charge supply capability when the power-supply potential indicates a third state (the power-supply potential is higher than the second comparison potential).

Accordingly, when the difference between the power-supply potential and the step-up potential is so small that generation of the step-up potential at a maximum level is required, the step-up potential is generated with the relatively large, first charge supply capability so that the step-up potential can be supplied without potential reduction; when the difference between the power-supply potential and the step-up potential is so large that the step-up potential has an allowance, the step-up potential is generated with the relatively small, second charge supply capability with suppressed power consumption; and when the difference between the power-supply potential and the step-up potential is extremely large and it is desirable to suppress the rise of the step-up potential, the step-up potential is generated with the extremely small, third charge supply capability to suppress the rise of the step-up potential to a required minimum.

This provides a step-up potential supply circuit which can supply the step-up potential at a suitable level with suppressed power consumption.

The step-up potential generating means of the step-up potential supply circuit of the seventh aspect has first to third charge pump means: the first charge pump means is always in an active state, the second charge pump means enters an active state when the control signal indicates the first state and enters an inactive state when the control signal indicates the second state or the third state, and the third charge pump means enters an active state when the control signal indicates the first state or the second state, and enters an inactive state when the control signal indicates the third state.

Consequently, when the power-supply potential is in the first state, the second and third charge pump means go into an active state to realize the relatively large, first charge supply capability corresponding to a sum of first to third partial charge supply capabilities; when the power-supply potential is in the second state, the second charge pump means goes into an inactive state and the third charge pump means goes into an active state to realize the relatively small, second charge supply capability corresponding to a sum of the first partial charge supply capability and the third partial charge supply capability; and when the power-supply potential is in the third state, the second and third charge pump means go into an inactive state to realize the extremely small, third charge supply capability only with the first partial charge supply capability.

In the step-up potential supply circuit of the eighth aspect, the power-supply potential detecting means has first and second partial power-supply potential detecting means; the first partial power-supply potential detecting means outputs to the second charge pump means a first partial control signal indicating the first state in which the power-supply potential is lower than the first comparison potential, or the second or third state in which the power-supply potential is higher than the first comparison potential, and the second partial power-supply potential detecting means outputs, to the third charge pump means, a second partial control signal indicating the first state or the second state in which the power-supply potential is lower than the second comparison potential or the third state in which the power-supply potential is higher than the second comparison potential.

Accordingly, the second charge pump means is controlled between active and inactive by the first partial control signal from the first partial power-supply potential detecting means and the third charge pump means is controlled between active and inactive by the second partial control signal from the second partial power-supply potential detecting means.

The semiconductor storage device of the ninth aspect of the present invention includes the step-up potential supply circuit of the first aspect, and an internal circuit connected to the step-up potential node which operates with the step-up potential as an operating power-supply potential.

Accordingly, the internal circuit can receive the step-up potential supplied from the step-up potential node with a suitable charge supply capability according to variation in the power-supply potential, which enables normal operation even with the power-supply potential varying.

In the semiconductor storage device of the tenth aspect, the memory cell array includes a plurality of dynamic memory cells and the internal circuit includes a memory cell selecting line control circuit for setting a memory cell selecting line at the step-up potential in a selected state. The memory cell selecting line control circuit can set the memory cell selecting line in a selected state at the step-up potential at a suitable level even if the power-supply potential changes, so as to enable correct access to a certain number of memory cells connected to the memory cell selecting line.

The present invention has been made to solve the problems explained above, and it is an object to obtain a step-up potential supply circuit which can supply suitable step-up potential with reduced dissipation current even if the power-supply potential varies in a relatively wide range.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
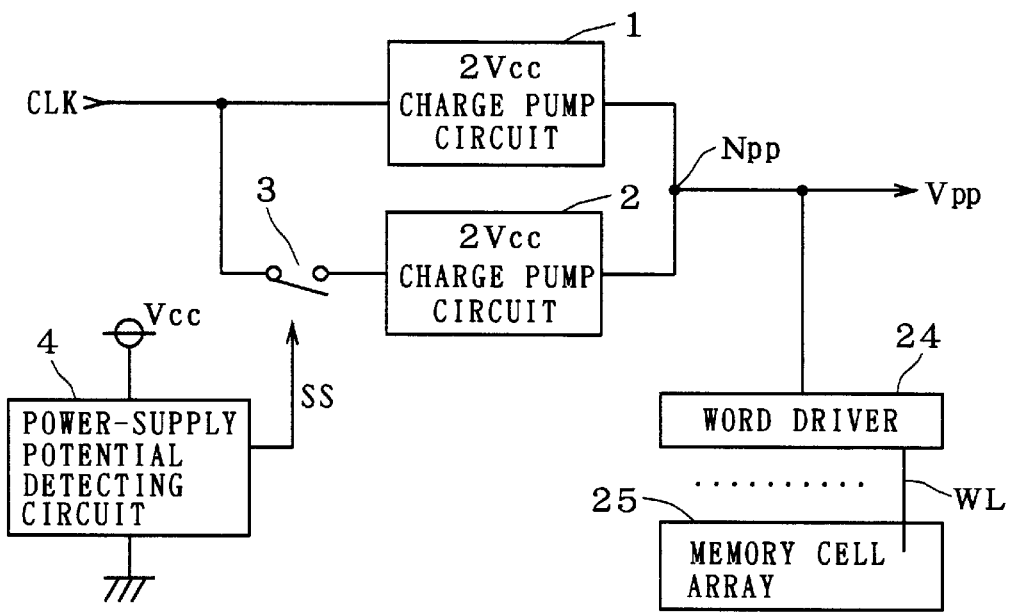
FIG. 1 is a block diagram showing the structure of a step-up potential supply circuit according to a first preferred embodiment of the present invention.

FIG. 1 is a block diagram showing the structure of a step-up potential supply circuit according to a first preferred embodiment of the present invention. As shown in this diagram, the common output of the two 2Vcc charge pump circuits 1 and 2 serves as the step-up potential node Npp. The 2Vcc charge pump circuit 1 always receives an oscillation signal CLK from a ring oscillator not shown to generate a step-up potential Vpp at the step-up potential node Npp with a first partial charge supply capability. The 2Vcc charge pump circuit 2 receives the oscillation signal CLK through the switch portion 3. When the switch portion 3 is in an ON state, it enters an active state to generate the step-up potential Vpp at the step-up potential node Npp with a second partial charge supply capability.

The step-up potential supply circuit of the first preferred embodiment is provided in a DRAM. Internal circuits of the RAM which require the step-up potential Vpp, such as the word driver 24, are connected to the step-up potential node Npp. When driven, the word driver 24 using the step-up potential Vpp as an operation power-supply potential causes the potential on a word line WL in an active state to be at the step-up potential Vpp to enable access to a certain number of memory cells connected to the word line WL at the step-up potential Vpp in the memory cell array 25.

The power-supply potential detecting circuit 4 receives the power-supply potential Vcc and detects it. When the power-supply potential is higher than a first comparison potential, it outputs a switching signal SS indicating OFF to the switch portion 3, and when it is lower than the first comparison potential, it outputs the switching signal SS indicating ON to the switch portion 3.

Figure 23:
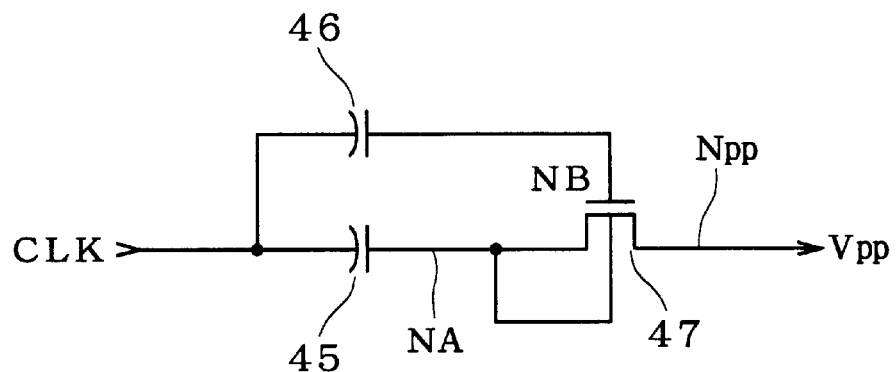
FIG. 23 is a circuit diagram showing another structure of the charge pump circuit.
Figure 25:
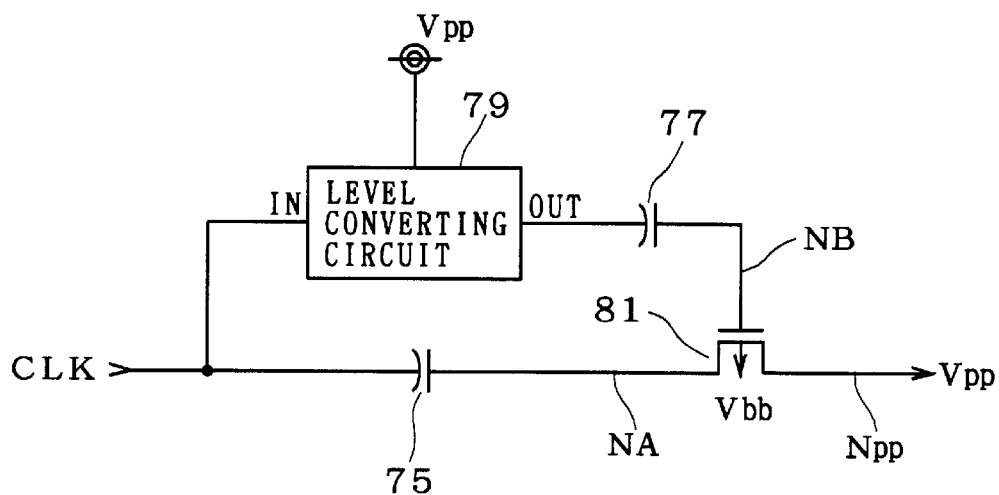
FIG. 25 is a circuit diagram showing another structure of the charge pump circuit.
Figure 27:
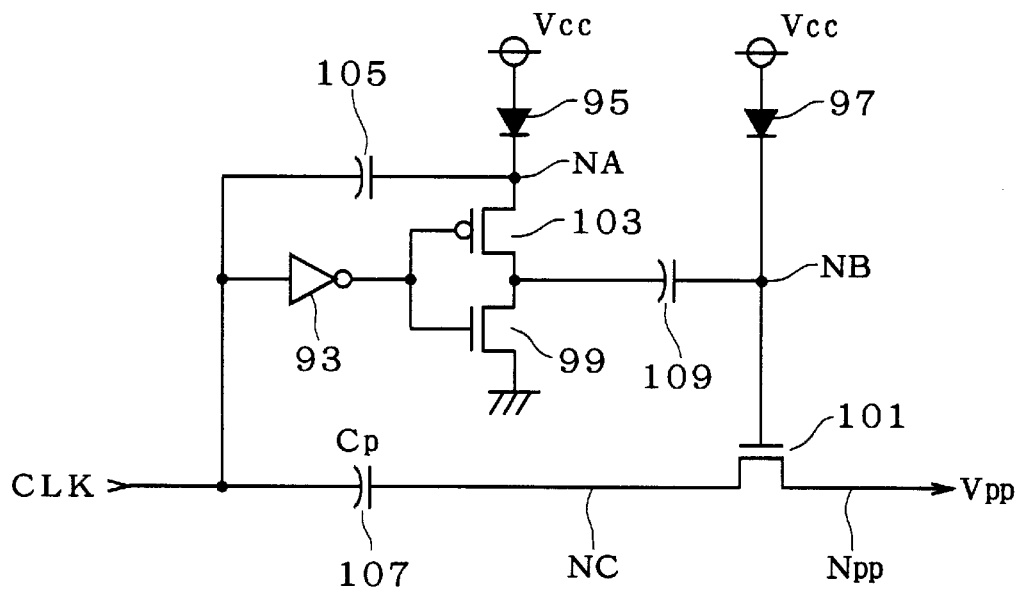
FIG. 27 is a circuit diagram showing another structure of the charge pump circuit.
Figure 28:
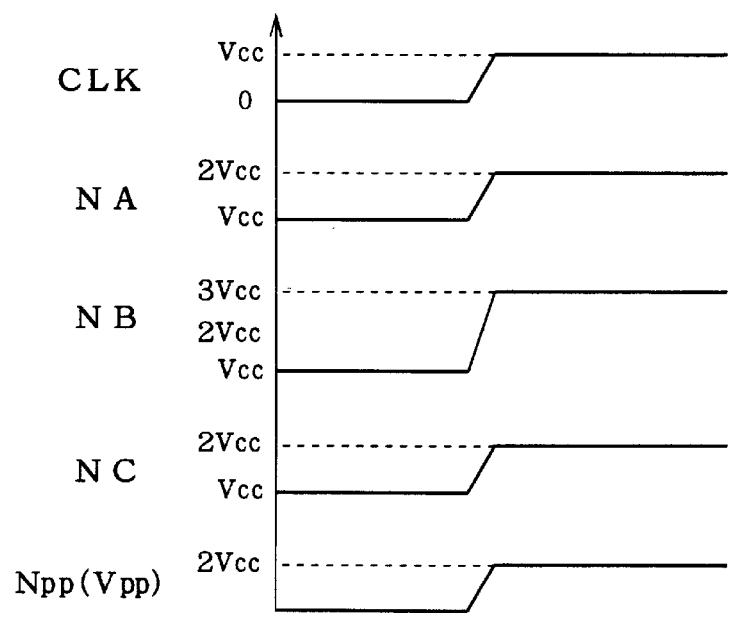
FIG. 28 is a timing diagram showing the operation of the charge pump circuit in FIG. 27.
Figure 29:
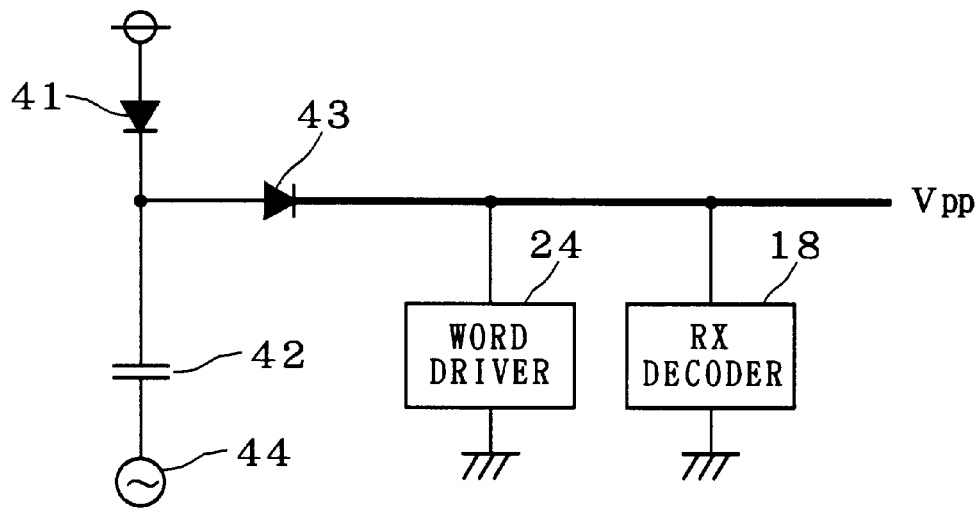
FIG. 29 is an explanation drawing showing an example of utilization of a Vpp power-supply.
Figure 30:
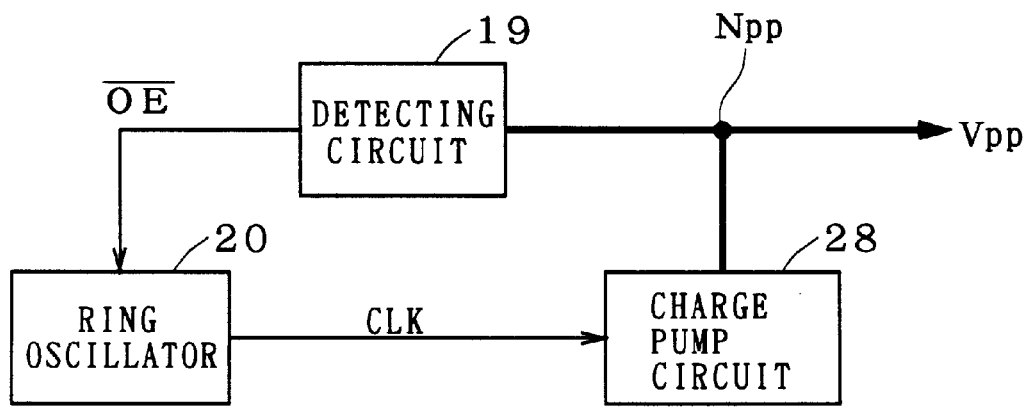
FIG. 30 is a block diagram showing an example of the step-up potential supply circuit.
Figure 31:
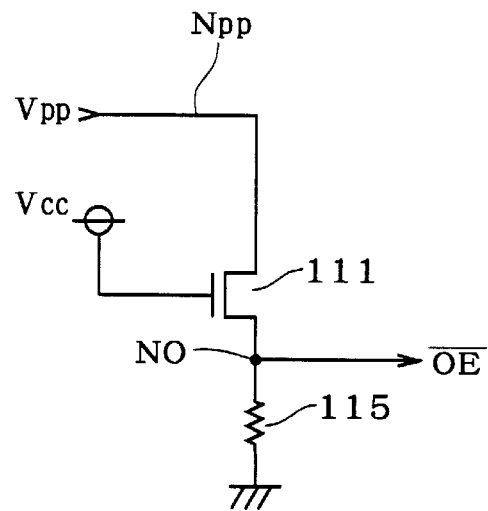
FIG. 31 is a circuit diagram showing a structure of the detecting circuit of FIG. 30.
Figure 32:
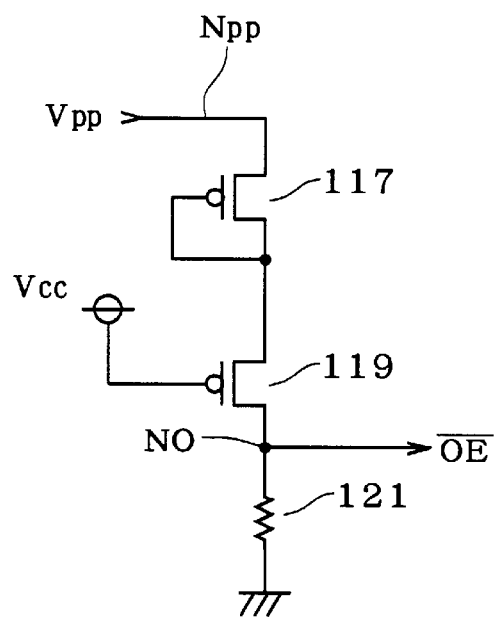
FIG. 32 is a circuit diagram showing another structure of the detecting circuit of FIG. 30.

The 2Vcc charge pump circuits 1 and 2 have the same internal structure as that shown in FIG. 23, FIG. 25 or FIG. 27 and the pump capacitors (the capacitor 45 in FIG. 23, the capacitor 75 in FIG. 25 and the capacitor 107 in FIG. 27) have the same capacitance value. The first partial charge supply capability and the second partial charge supply capability are therefore the same.

Figure 2:
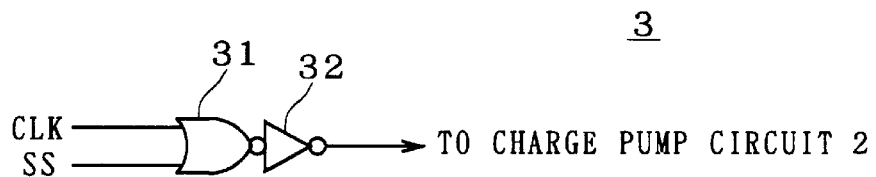
FIG. 2 is a circuit diagram showing the internal structure of the switch portion of FIG. 1.

FIG. 2 is a circuit diagram showing the switch portion 3 in detail. As shown in this diagram, the switch portion 3 is formed of an OR gate 31 and an inverter 32. The OR gate 31 receives the oscillation signal CLK at its one input and receives the switching signal SS at its other input, whose output is provided to the input of the inverter 32. The output of the inverter 32 is provided to the 2Vcc charge pump circuit 2.

With this structure, when the switching signal SS is "H", the output of the inverter 32 goes "H" irrespective of the oscillation signal CLK. Hence, the fixed voltage "H" is provided to the 2Vcc charge pump circuit 2 and then the 2Vcc charge pump circuit 2 goes into an inactive state. On the other hand, when the switching signal SS is "L", the oscillation signal CLK appears as it is as the output of the inverter 32 and therefore the 2Vcc charge pump circuit 2 goes into an active state.

Figure 3:
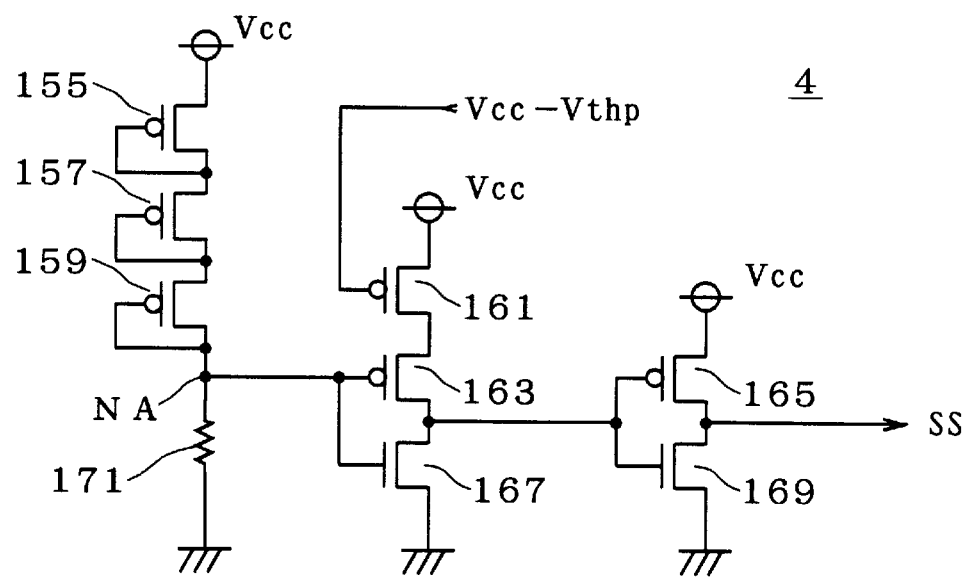
FIG. 3 is a circuit diagram showing an internal structure of the power-supply potential detecting circuit of FIG. 1.

FIG. 3 is a circuit diagram showing the power-supply potential detecting circuit 4 of FIG. 1 in detail. The same parts as those in FIG. 1 are shown at the same reference characters and not fully described again.

Referring to FIG. 3, the power-supply potential detecting circuit 4 is formed of PMOS transistors 155, 157, 159, 161, 163 and 165, NMOS transistors 167, 169 and a resistor element 171.

The PMOS transistors 155, 157, 159 and the resistor element 171 are connected in series between the power-supply potential Vcc and the ground level. The PMOS transistors 155, 157 and 159 are diode-connected. The PMOS transistors 161, 163 and the NMOS transistor 167 are connected in series between the power-supply potential Vcc and the ground level. A potential (Vcc−Vthp) is applied to the gate of the PMOS transistor 161. The threshold voltage of the PMOS transistor 161 is taken as Vthp. The threshold voltage of the PMOS transistors 155–159 is taken as Vthp as well. The gates of the PMOS transistor 163 and the NMOS transistor 167 are connected to the node NA. The PMOS transistor 165 and the NMOS transistor 169 are connected in series between the power-supply potential Vcc and the ground potential level to form a CMOS inverter. The input portion of the CMOS inverter is connected to the drain of the NMOS transistor 167 and its output portion (the drain of the NMOS transistor 169) outputs the switching signal SS.

With this structure, when the power-supply potential Vcc is higher than 3Vthp (the first comparison potential), the node NA is charged. Then the PMOS transistor 163 turns off and the NMOS transistor 167 turns on. In response, the PMOS transistor 165 turns on and the NMOS transistor 169 turns off. Accordingly, when the power-supply potential Vcc has a potential level larger than 3Vthp, a switching signal SS at an "H" level is outputted to the switch portion 3 of FIG. 1. As the result, the switch portion 3 turns off and the fixed voltage "H" is provided to the 2Vcc charge pump circuit 2, and the 2Vcc charge pump circuit 2 goes into an inactive state.

On the other hand, when the power-supply potential Vcc is smaller than 3Vthp, the node NA is not charged. Hence, the PMOS transistor 163 turns on and the NMOS transistor 167 turns off. In response, the PMOS transistor 165 turns off and the NMOS transistor 169 turns on. A switching signal SS at an "L" level is thus outputted to the switch portion 3 of FIG. 1 when the power-supply potential Vcc is smaller than 3Vthp. As the result, the switch portion 3 turns on, the 2Vcc charge pump circuit 2 is provided with the oscillation signal CLK as it is, and then the 2Vcc charge pump circuit 2 enters an active state.

Figure 4:
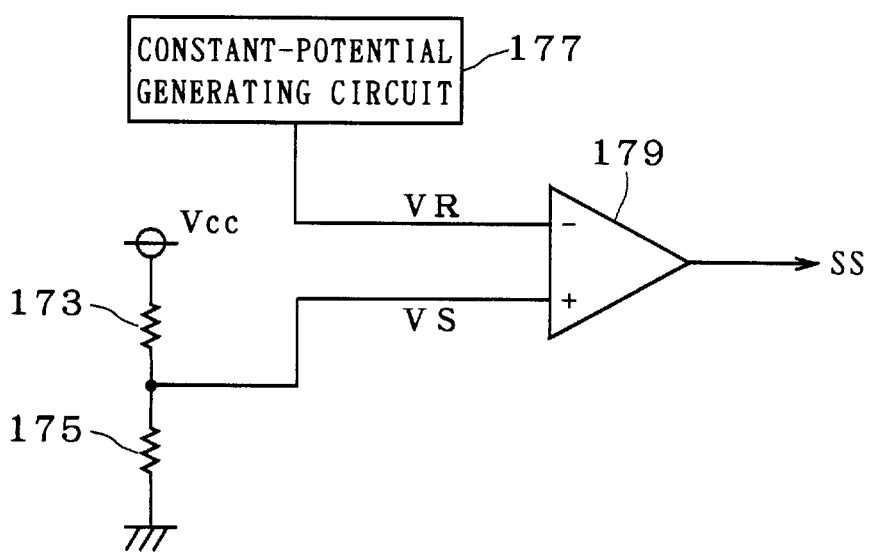
FIG. 4 is a circuit diagram showing another internal structure of the power-supply potential detecting circuit 4 of FIG. 1.

FIG. 4 is a circuit diagram showing another example of the power-supply potential detecting circuit 4 of FIG. 1. As shown in the diagram, the power-supply potential detecting circuit is formed of a constant-potential generating circuit 177, a comparator 179 and resistor elements 173 and 175. The resistor element 173 and the resistor element 175 connected in series between the power-supply potential Vcc and the ground level form a level shifter circuit.

The constant-potential generating circuit 177 provides a reference potential VR at a certain level to the negative input of the comparator 179. The level shifter circuit formed of the resistor elements 173 and 175 provides the positive input of the comparator 179 with a level shift potential VS obtained by level-shifting the power-supply potential Vcc. Now the resistance ratio of the resistors 173 and 175 is taken as Rα (≦1).

The comparator 179 compares the reference potential VR and the level shift potential VS. When the level shift potential VS is larger than the reference potential VR, that is, when the power-supply potential Vcc is larger than the potential {VR/Rα (the first comparison potential)}, it outputs the switching signal SS at an "H" level to the switch portion 3 of FIG. 1. On the other hand, when the level shift potential VS is smaller than the reference potential VR, the comparator 179 outputs the switching signal SS at an "L" level to the switch portion 3 of FIG. 1.

Thus, the power-supply potential detecting circuit 4 having the circuit structure shown in FIG. 3 compares the power-supply potential Vcc and the potential (3Vthp) corresponding to three of the thresholds of the PMOS transistors to output the switching signal SS and the power-supply potential detecting circuit 4 having the circuit structure shown in FIG. 4 compares the level shift potential VS, which is obtained by level-shifting the power-supply potential Vcc, and the reference potential VR to output the switching signal SS.

Figure 5:
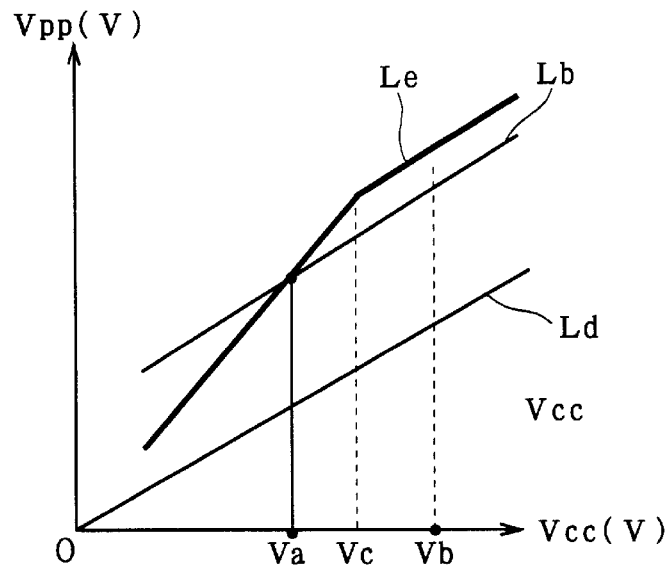
FIG. 5 is a graph for describing the operation of the step-up potential supply circuit of the first preferred embodiment.
Figure 33:
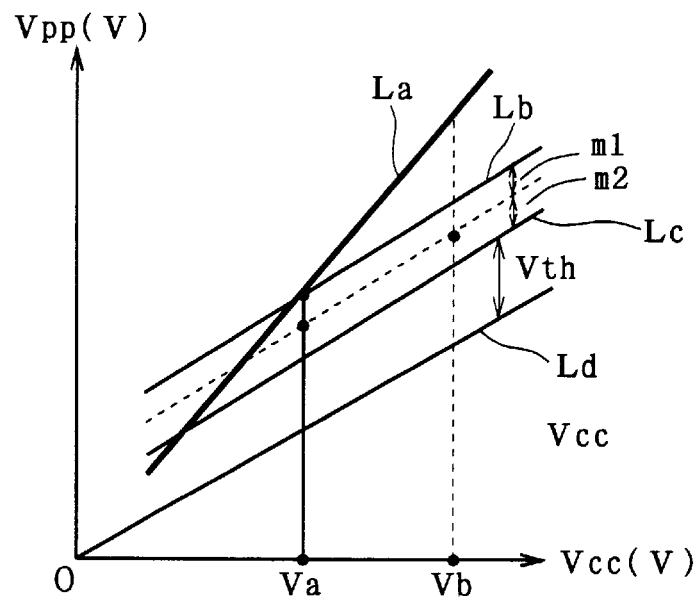
FIG. 33 is a graph showing the relation between the power-supply potential Vcc and the step-up potential Vpp.
Figure 34:
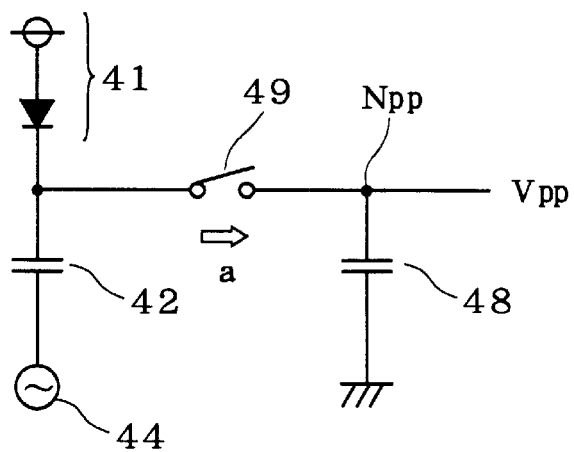
FIG. 34 is a circuit diagram showing a power-supply for supplying the step-up potential Vpp.

FIG. 5 is a graph showing a change of the step-up potential Vpp of the step-up potential supply circuit of the first preferred embodiment with respect to a change of the power-supply potential Vcc. In FIG. 5, the line Le shows the maximum step-up potential Vpp that the step-up potential generating circuit of the first preferred embodiment can certainly generate, the line Lb shows the step-up potential Vpp actually required by internal circuits such as the word driver 24, and the line Ld shows a change of the power-supply potential Vcc. The same parts as those in FIG. 33 are designated at the same reference characters and not fully described.

In FIG. 5, the potential Vc corresponds to the first comparison potential at which the switching signal SS is switched between "H" and "L" by the power-supply potential detecting circuit 4.

The step-up potential supply circuit of the first preferred embodiment with such a structure detects the power-supply potential Vcc with the power-supply potential detecting circuit 4. When the power-supply potential Vcc is lower than the first comparison potential Vc, the power-supply potential detecting circuit 4 outputs the switching signal SS at "L" to turn on the switch portion 3. This activates the 2Vcc charge pump circuit 2, in addition to the 2Vcc charge pump circuit 1 always in an active state. This provides a relatively large charge supply capability (the first partial charge supply capability+the second partial charge supply capability), which is twice that by the 2Vcc charge pump circuit 1 in an active state.

Accordingly, even with a relatively low power-supply potential Vcc around the potential Va (about 1.5V), the relatively large charge supply capability (a first charge supply capability) by the 2Vcc charge pump circuits 1 and 2 ensures supply of a 2Vcc step-up potential Vpp to the step-up potential node Npp. Hence, it is possible, even if the power-supply potential Vcc falls to the potential Va, to supply the step-up potential Vpp which satisfies the potential actually required by internal circuits in the DRAM, such as the word driver 24.

On the other hand, when the power-supply potential Vcc is higher than the first comparison potential Vc, the power-supply potential detecting circuit 4 is caused to output the switching signal SS at "H" to turn off the switch portion 3. The 2Vcc charge pump circuit 2 then enters an inactive state and the step-up potential Vpp is thus supplied with the first partial charge supply capability (a second charge supply capability) by only the 2Vcc charge pump circuit 1 always in the active state.

Then, the step-up potential Vpp (Le) is below 2Vcc since the step-up potential Vpp is supplied to the step-up potential node Npp with the relatively small charge supply capability (the second charge supply capability) by the 2Vcc charge pump circuit 1 alone, but it causes no problem because it sufficiently exceeds the actually required potential (Lb). This also provides the effect of reducing the power consumption as the charge supply capability is suppressed to a required minimum.

Thus the word driver 24 (refer to FIG. 1) in the DRAM having the step-up potential supply circuit of the first preferred embodiment can correctly access a certain number of memory cells connected to a word line WL at the step-up potential Vpp in the memory cell array 25.

Although the first and second partial charge supply capabilities of the 2Vcc charge pump circuits 1 and 2 are set at the same level in the first preferred embodiment, the first partial charge supply capability and the second partial charge supply capability may be set at different values.

<Second Preferred Embodiment>

Figure 6:
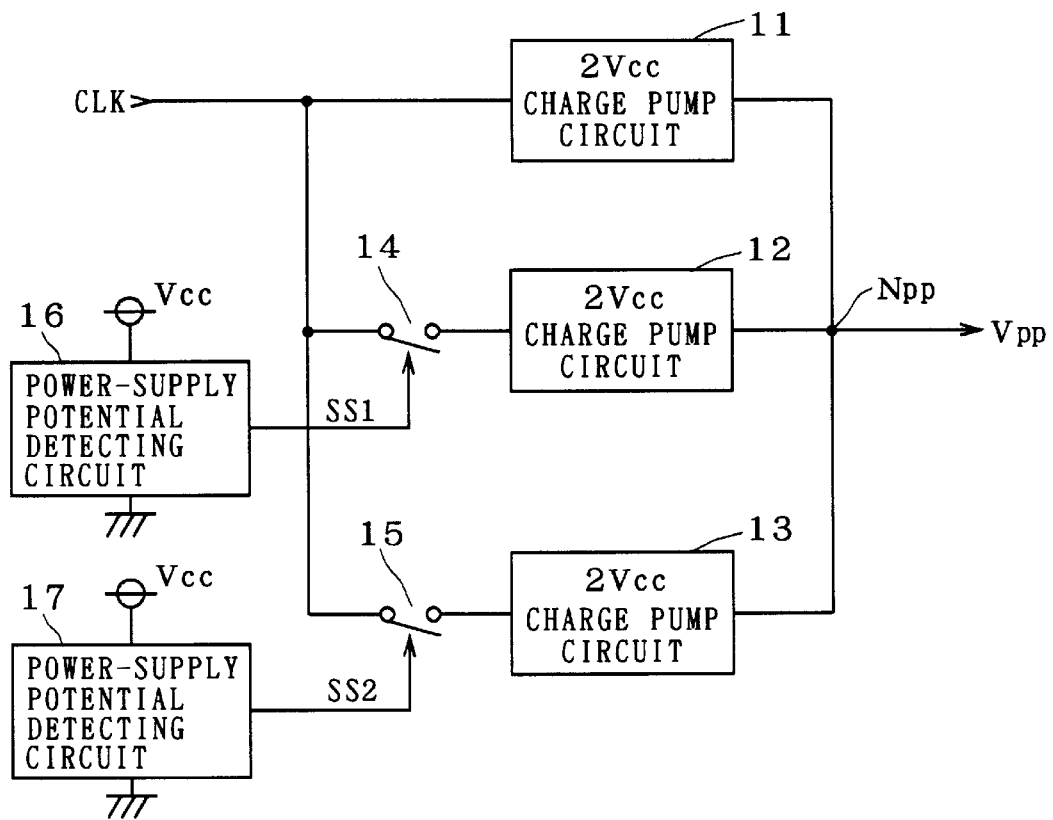
FIG. 6 is a block diagram showing the structure of a step-up potential supply circuit according to a second preferred embodiment of the present invention.

FIG. 6 is a block diagram showing the structure of a step-up potential supply circuit according to a second preferred embodiment of the present invention. As shown in this diagram, the common output of the three 2Vcc charge pump circuits 11, 12 and 13 serves as the step-up potential node Npp. The 2Vcc charge pump circuit 11 always receives the oscillation signal CLK from a ring oscillator not shown to generate the step-up potential Vpp at the step-up potential node Npp with a first partial charge supply capability. On the other hand, the 2Vcc charge pump circuit 12 receives the oscillation signal CLK through the switch portion 14. When the switch portion 14 is in an ON state, it enters an active state to generate the step-up potential Vpp at the step-up potential node Npp with a second partial charge supply capability. The 2Vcc charge pump circuit 13 receives the oscillation signal CLK through the switch portion 15. When the switch portion 15 is in an ON state, it enters an active state to generate the step-up potential Vpp at the step-up potential node Npp with a third partial charge supply capability.

The power-supply potential detecting circuit 16 receives the power-supply potential Vcc. When the power-supply potential is higher than a first comparison potential Vc (refer to FIG. 5), it outputs a switching signal SS1 indicating OFF to the switch portion 14, and when it is lower than the first comparison potential, it outputs the switching signal SS1 indicating ON to the switch portion 14.

The power-supply potential detecting circuit 17 receives the power-supply potential Vcc. When it is above a second comparison potential (about 4V) which sufficiently exceeds a level for normal operation, for example, the power-supply potential detecting circuit 17 outputs a switching signal SS2 indicating OFF to the switch portion 15 and when it is below the second comparison potential, it outputs the switching signal SS2 indicating ON to the switch portion 15.

Like the 2Vcc charge pump circuits 1 and 2 of the first preferred embodiment, the 2Vcc charge pump circuits 11, 12 and 13 have the internal circuit structure shown in FIG. 23, FIG. 25 or FIG. 27. However, note that the first partial charge supply capability is extremely small and the second and third partial charge supply capabilities are sufficiently larger than the first partial charge supply capability, at the same level as the first partial charge supply capability (=the second partial charge supply capability) of the 2Vcc charge pump circuit 1 in the first preferred embodiment.

The switch portions 14 and 15 have the same internal structure as the switch portion 3 in the first preferred embodiment and the power-supply potential detecting circuits 16 and 17 have the same internal structure as the power-supply potential detecting circuit 4 of the first preferred embodiment. The power-supply potential detecting circuit 16 and the power-supply potential detecting circuit 17 use different levels of comparison potentials to compare with the power-supply potential Vcc.

In the step-up potential supply circuit of the second preferred embodiment having this structure, the power-supply potential detecting circuits 16 and 17 detect the power-supply potential Vcc. When the power-supply potential Vcc is under the first comparison potential Vc, the power-supply potential detecting circuits 16 and 17 output the switching signals SS1 and SS2 both at "L" to cause both of the switch portions 14 and 15 to go into the ON state. Then, in addition to the 2Vcc charge pump circuit 11 which is always in an active state, the 2Vcc charge pump circuits 12 and 13 enter an active state, which provides a sufficiently large charge supply capability.

Accordingly, even with a relatively low power-supply potential Vcc around the potential Va, the charge supply capability (a first charge supply capability) corresponding to a sum of the first to third partial charge supply capabilities by the 2Vcc charge pump circuits 11–13 certainly supplies the step-up potential Vpp at 2Vcc to the step-up potential node Npp. Accordingly, even if the power-supply potential Vcc decreases to Va, it is possible to supply a step-up potential Vpp which satisfies the actually required potential.

On the other hand, when the power-supply potential Vcc exceeds the first comparison potential Vc and is lower than the second comparison potential, the power-supply potential detecting circuit 16 outputs the switching signal SS1 at "H" and the power-supply potential detecting circuit 17 outputs the switching signal SS2 at "L" to turn off the switch portion 14 and turn on the switch portion 15. Then the 2Vcc charge pump circuit 12 enters an inactive state and the 2Vcc charge pump circuit 13 enters an active state. Then the 2Vcc charge pump circuit 11 always in an active state and the 2Vcc charge pump circuit 13 supply a relatively small step-up potential Vpp.

Then the step-up potential Vpp (Le) is somewhat smaller than 2Vcc because it is supplied to the step-up potential node Npp with a relatively small charge supply capability (a second charge supply capability) corresponding to a sum of the first and third partial charge supply capabilities by the 2Vcc charge pump circuits 11 and 13, but it raises no problem because it is sufficiently above the actually required potential (Lb). This also provides the effect of reducing the power consumption since the charge supply capability is suppressed to a required minimum.

When the power-supply potential Vcc exceeds the second comparison potential, the power-supply potential detecting circuits 16 and 17 output the switching signals SS1 and SS2 both at "H" to turn off both of the switch portions 14 and 15. This forces both the 2Vcc charge pump circuits 12 and 13 to an inactive state, and then the step-up potential Vpp is supplied only by the 2Vcc charge pump circuit 11 always in an active state with an extremely small charge supply capability (a third charge supply capability).

When it is desirable to remove DRAMs, or the like, having initial failures, a test is conducted by applying a power-supply potential Vcc exceeding 4V, higher than that used in normal operation.

Recently, with improvements in miniaturization of devices, the gate oxide films of transistors are becoming thinner year by year. Accordingly, if the step-up potential Vpp becomes higher than needed with respect to the power-supply potential Vcc, the gate oxide films may be broken in the test, resulting in breakage of normal DRAMs.

Considering such testing, the step-up potential supply circuit of the second preferred embodiment supplies the step-up potential Vpp with the third, smallest charge supply capability when the power-supply potential Vcc becomes higher than the second comparison potential. This prevents the step-up potential Vpp from becoming higher than necessary with respect to the power-supply potential Vcc, which provides the effect of enabling the testing without any problem, without damaging the gate oxide films.

<Third Preferred Embodiment>

Figure 7:
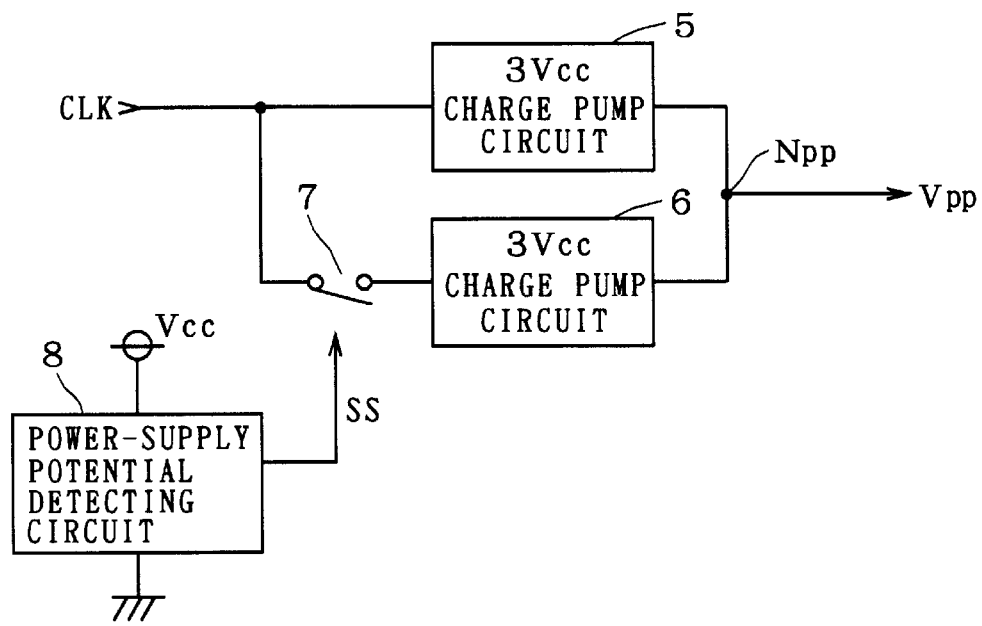
FIG. 7 is a block diagram showing the structure of a step-up potential supply circuit according to a third preferred embodiment of the present invention.

FIG. 7 is a block diagram showing the structure of a step-up potential supply circuit according to a third preferred embodiment of the present invention. As shown in this diagram, the common output of the two 3Vcc charge pump circuits 5 and 6 serves as the step-up potential node Npp. The 3Vcc charge pump circuit 5 always receives the oscillation signal CLK from a ring oscillator not shown to generate the step-up potential Vpp at the step-up potential node Npp with a first partial charge supply capability. The 3Vcc charge pump circuit 6 receives the oscillation signal CLK through the switch portion 7. When the switch portion 7 is in an ON state, it enters an active state to generate the step-up potential Vpp at the step-up potential node Npp with a second partial charge supply capability (equal to the first partial charge supply capability).

The power-supply potential detecting circuit 8 receives the power-supply potential Vcc. When the power-supply potential is higher than a first comparison potential, it outputs a switching signal SS indicating OFF to the switch portion 7, and when it is lower than the first comparison potential, it outputs the switching signal SS indicating ON to the switch portion 7. the switch portion 7 has the same internal structure as the switch portion 3 of the first preferred embodiment shown in FIG. 2, and the power-supply potential detecting circuit 8 has the same internal structure as the power-supply potential detecting circuit 4 of the first preferred embodiment shown in FIG. 3 or FIG. 4.

Figure 8:
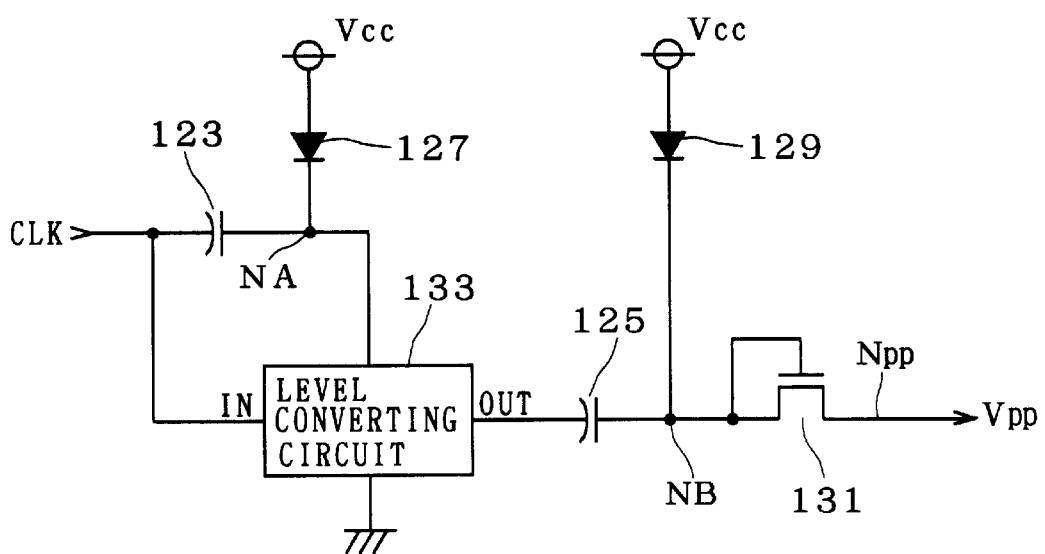
FIG. 8 is a circuit diagram showing an internal structure of the 3Vcc charge pump circuit of FIG. 8.

FIG. 8 is a circuit diagram showing an example of the internal structure of the 3Vcc charge pump circuit 5 (6). As shown in this diagram, the 3Vcc generating charge pump circuit 5 is formed of capacitors 123, 125, diodes 127, 129, an NMOS transistor 131 and a level converting circuit 133.

Figure 26:
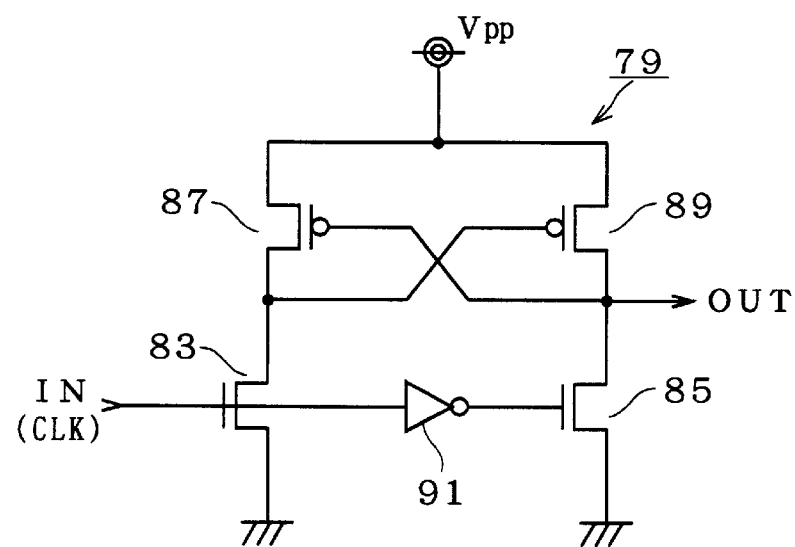
FIG. 26 is a circuit diagram showing the structure of the level converting circuit.

The capacitor 123 is interposed between the input node for the clock signal CLK and the node NA. The anode of the diode 127 receives the power-supply potential Vcc and its cathode is connected to the node NA. The capacitor 125 is interposed between the output node of the level converting circuit 133 and the node NB. The anode of the diode 129 receives the power-supply potential Vcc and its cathode is connected to the node NB. The NMOS transistor 131 is interposed between the node NB and the step-up potential node Npp. The gate of the NMOS transistor 131 is connected to the node NB. The level converting circuit 133 has the same internal structure as the level converting circuit shown in FIG. 26. They are different only in that the node receiving the step-up potential Vpp of the level converting circuit in FIG. 26 is replaced by the node NA receiving the power-supply potential Vcc through the diode 127. The node NA is caused to be at the power-supply potential Vcc level by the diode 127 as a precharge circuit.

With this structure, when the clock signal CLK provided to the capacitor 123 is forced to go from the ground level to the power-supply potential Vcc level, the potential at the node NA attains the 2Vcc level because of the capacitive coupling of the capacitor 123. The level converting circuit 133, using the node NA having the 2Vcc level potential as an operation power-supply, is caused to output the 2Vcc level potential to the capacitor 125. That is to say, the level converting circuit 133 receives the clock signal CLK having amplitude of the ground level to the power-supply potential Vcc as an input signal IN, enlarges the amplitude of the input signal IN, and outputs the output signal OUT having the amplitude of the ground level to 2Vcc.

When the 2Vcc potential is applied to the capacitor 125, the potential at the node NB precharged to the power-supply potential Vcc becomes 3Vcc due to the capacitive coupling of the capacitor 125. The NMOS transistor 131 transfers the 3Vcc level potential at the node NB to the step-up potential node Npp. More correctly, a potential of (3Vcc–Vthn) is transferred to the step-up potential node Npp because of the influence of the threshold voltage Vthn of the NMOS transistor 131.

The 3Vcc charge pump circuit 5 (6) having the structure shown in FIG. 8 can thus generate a maximum step-up potential Vpp of (3Vcc–Vthn).

Figure 9:
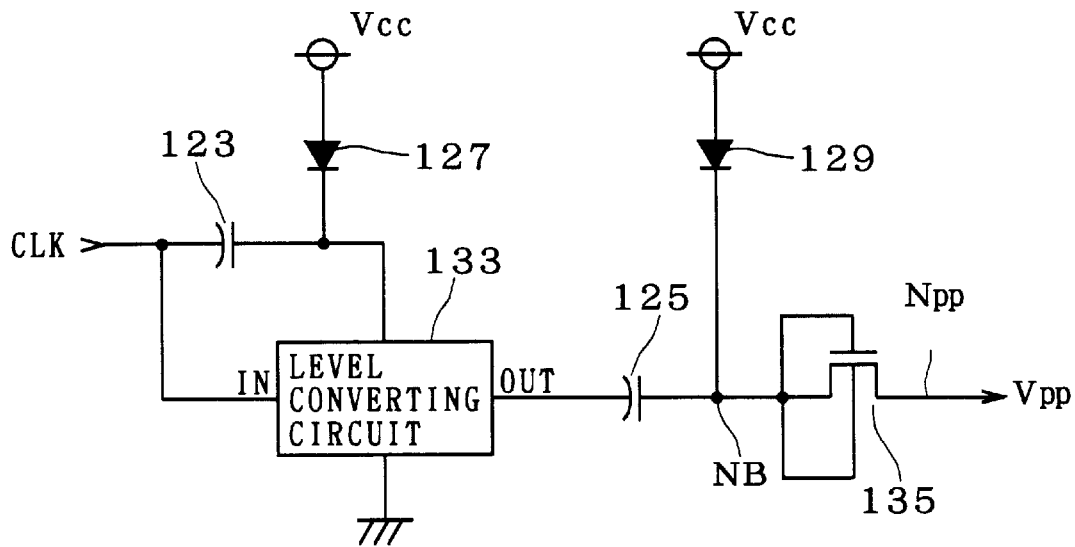
FIG. 9 is a circuit diagram showing another internal structure of the 3Vcc charge pump circuit of FIG. 8.

FIG. 9 is a circuit diagram showing another example of the structure of the 3Vcc charge pump generating circuit 5 (6). The same parts as those in FIG. 8 are shown at the same reference characters and not fully explained.

Figure 24:
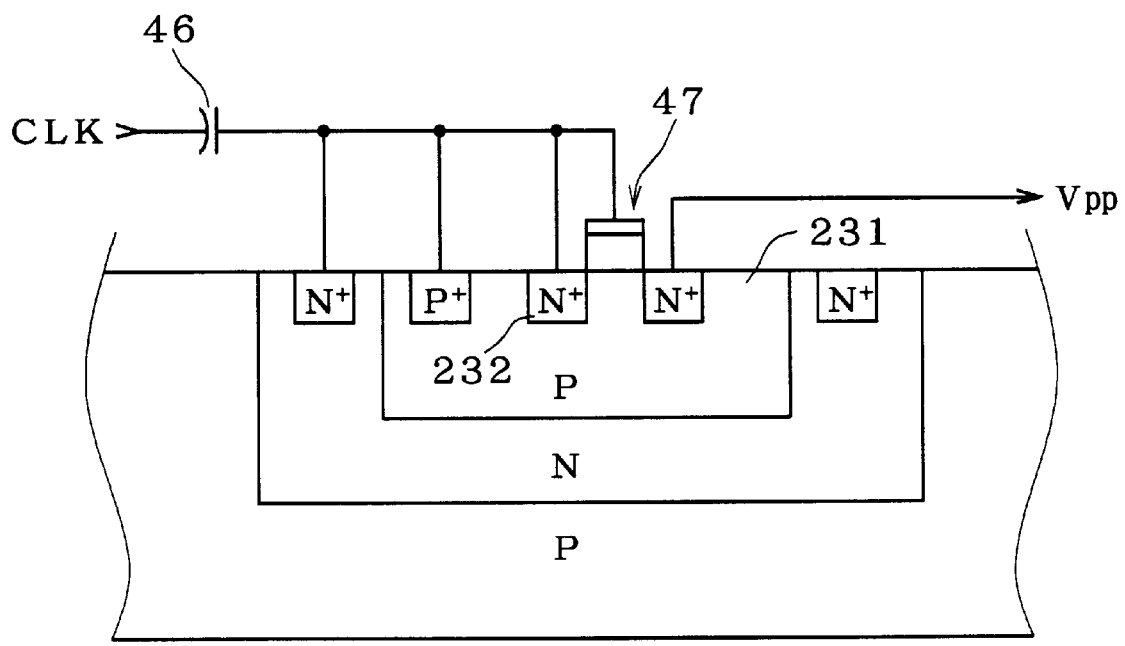
FIG. 24 is a sectional view showing the structure of the transistor in the charge pump circuit of FIG. 23.

Referring to FIG. 9, the NMOS transistor 135 is interposed between the node NB and the step-up potential node Npp. The gate of the NMOS transistor 135 is connected to the node NB. This NMOS transistor 135 differs from the NMOS transistor 131 in FIG. 8 in that the NMOS transistor 135 adopts such a triple-well structure as shown in FIG. 24. The 3Vcc generating charge pump circuit 5 of FIG. 9 adopting the NMOS transistor 135 with the triple-well structure can reduce the influence of the threshold voltage when transferring the potential at the 3Vcc level at the node NB to the step-up potential node Npp, as compared with that adopting the common NMOS transistor 131.

That is to say, the maximum step-up potential Vpp that the 3Vcc generating charge pump circuit 5 of FIG. 9 is (3Vcc–Vv). This is larger than the maximum step-up potential Vpp that the 3Vcc generating charge pump circuit 5 with the structure of FIG. 8 can generate because the PN junction voltage Vv is smaller than the threshold voltage Vthn.

Figure 10:
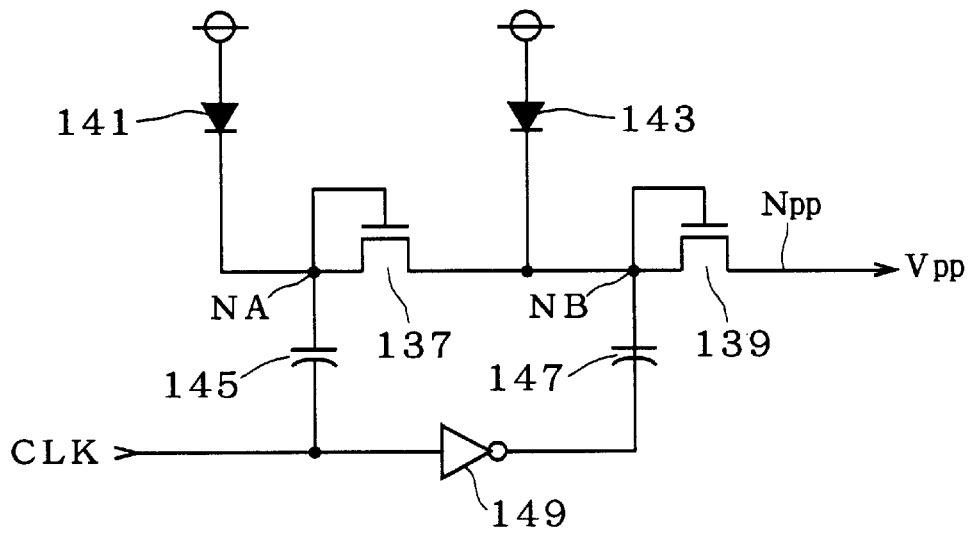
FIG. 10 is a circuit diagram showing another internal structure of the 3Vcc charge pump circuit in FIG. 8.

FIG. 10 is a circuit diagram showing another example of the 3Vcc generating charge pump circuit 5 (6) in detail. As shown in this diagram, the 3Vcc generating charge pump circuit 5 is formed of diodes 141, 143, NMOS transistors 137, 139, capacitors 145, 147 and an inverter 149.

The capacitor 145 is interposed between the node NA and the input node for the clock signal CLK. The anode of the diode 141 receives the power-supply potential Vcc and its cathode is connected to the node NA. The gate of the NMOS transistor 137 is connected to the node NA. The anode of the diode 143 receives the power-supply potential Vcc and its cathode is connected to the node NB. The NMOS transistor 139 is interposed between the node NB and the step-up potential node Npp. The gate of the NMOS transistor 139 is connected to the node NB. The capacitor 147 is interposed between the node NB and the output portion of the inverter 149. The inverter 149 receives the clock signal CLK as an input. The thresholds of the NMOS transistors 137 and 139 are both taken as Vthn.

Figure 11:
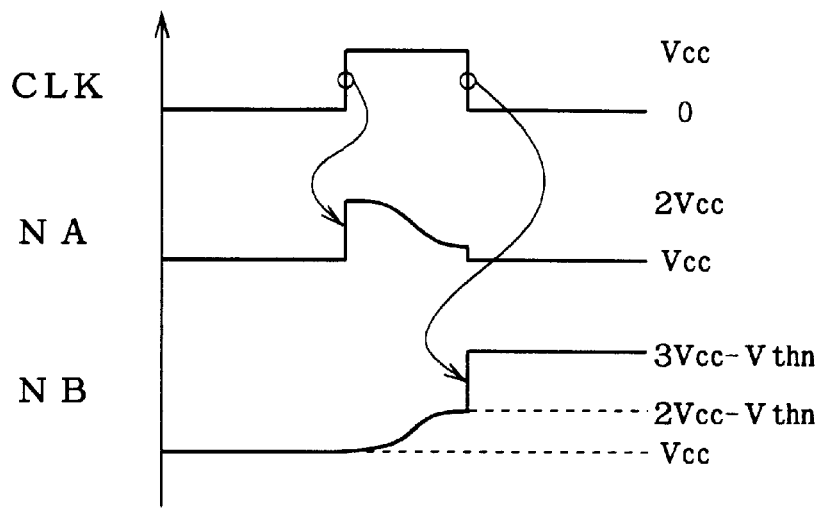
FIG. 11 is a timing diagram showing the operation of the 3Vcc charge pump circuit in FIG. 10.

FIG. 11 is a timing diagram for explaining operation of the 3Vcc generating charge pump circuit 5 having the structure shown in FIG. 10.

Operation of the 3Vcc generating charge pump circuit will now be explained referring to FIG. 10 and FIG. 11. The node NA is precharged to the power-supply potential Vcc by the diode 141. When the clock signal CLK go to the power-supply potential Vcc from the ground level (0V), the potential at the node NA goes to the 2Vcc level because of the capacitive coupling of the capacitor 145. The potential at the 2Vcc level at the node NA is transferred to the node NB through the NMOS transistor 137. Accordingly, the potential at the node NB, which has been precharged to the power-supply potential Vcc, rises over the power-supply potential Vcc to attain a potential (2Vcc–Vthn).

Next, when the clock signal CLK is forced to the ground level (0V) from the power-supply potential Vcc, the clock signal CLK is inverted by the inverter 149 and the power-supply potential Vcc is provided to the capacitor 147. Then the potential at the node NB having the potential (2Vcc–Vthn) rises to (3Vcc–Vthn) due to the capacitive coupling of the capacitor 147. Then the NMOS transistor 139 transfers the potential of (3Vcc–Vthn) at the node NB to the step-up potential node Npp as the step-up potential Vpp. More correctly, considering the threshold voltage Vthn, a potential of (3Vcc–2Vthn) is applied to the node Npp. The 3Vcc generating charge pump circuit 5 constructed this way can generate a maximum step-up potential Vpp at the (3Vcc–2Vthn) level.

The operation of the 3Vcc generating charge pump circuit having the structure shown in FIG. 10 can be summarized as follows: a first stepping-up operation is applied to the power-supply potential Vcc at the node NA and a second stepping-up operation is further applied at the node NB, and the step-up potential Vpp at the (3Vcc−2Vthn) level is generated at the step-up potential node Npp.

Figure 12:
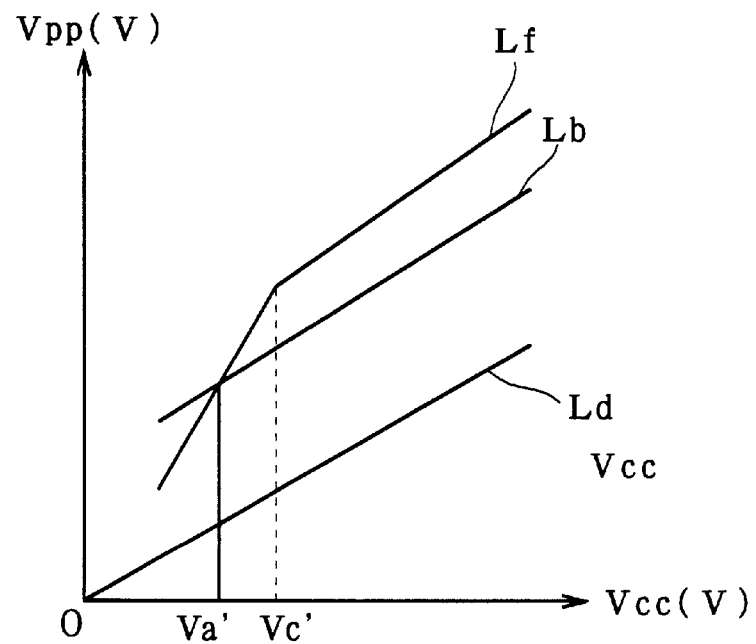
FIG. 12 is a graph for use in describing the operation of the step-up potential supply circuit of the third preferred embodiment.
Figure 13:
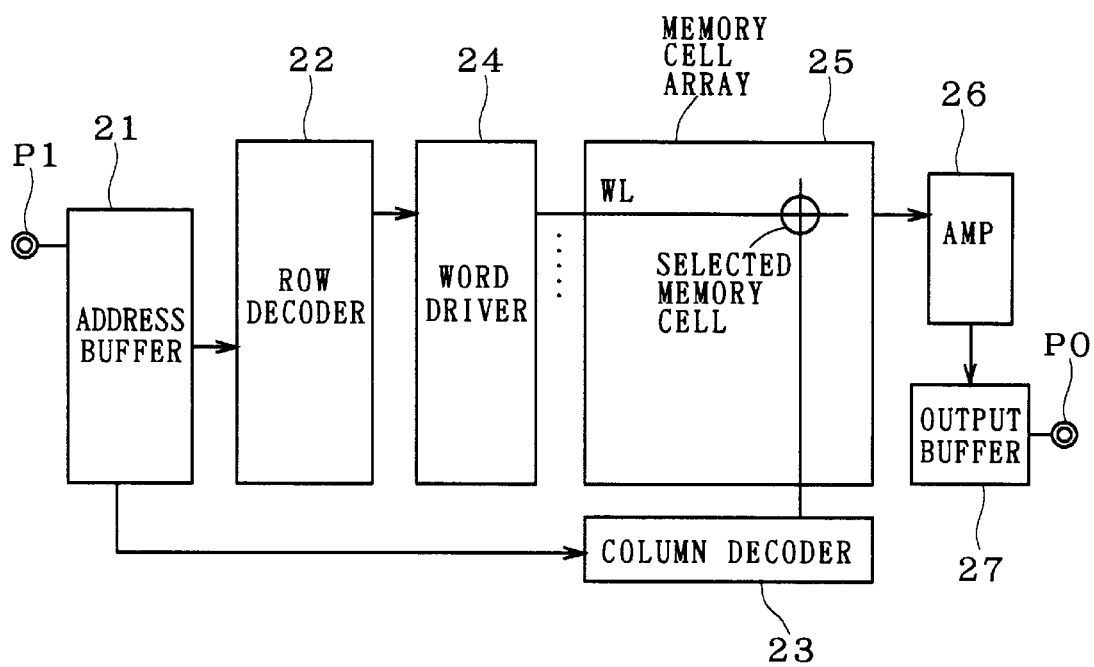
FIG. 13 is a block diagram showing the overall circuit structure of a conventional DRAM.
Figure 14:
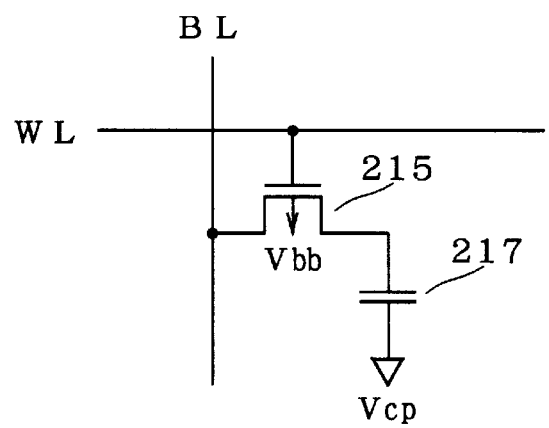
FIG. 14 is an explanation drawing showing the structure of a memory cell of the DRAM.
Figure 15:
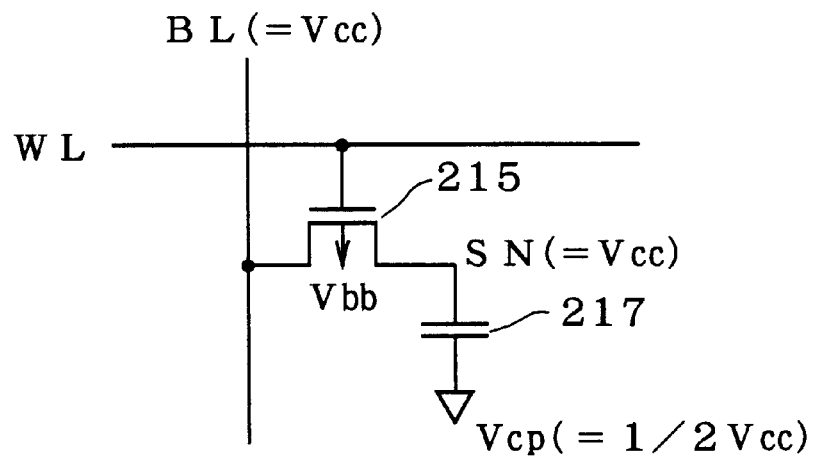
FIG. 15 is an explanation drawing showing the structure of a memory cell of the DRAM.
Figure 16:
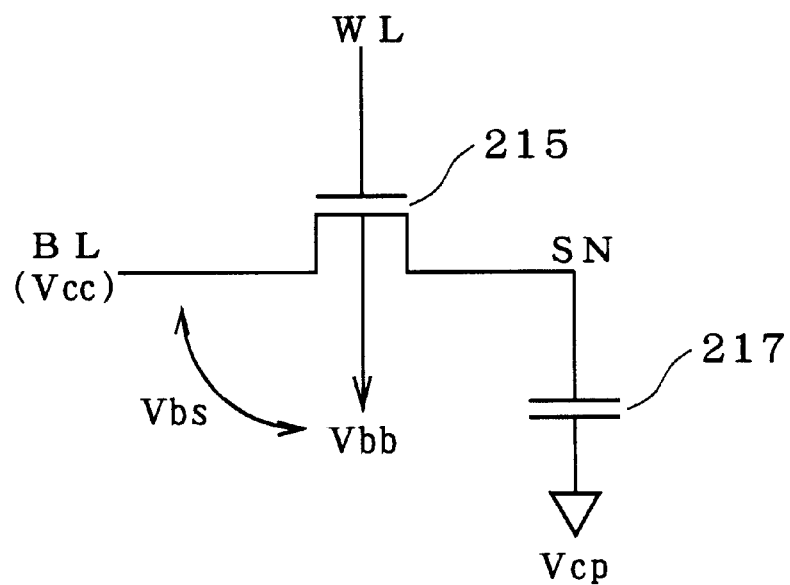
FIG. 16 is an explanation drawing showing the structure of a memory cell of the DRAM.
Figure 17:
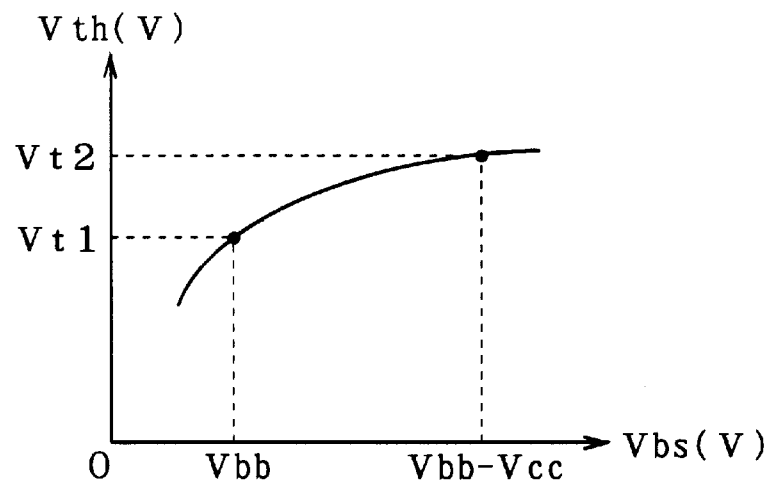
FIG. 17 is a graph showing an increase of the threshold of the transistor of the memory cell due to the substrate effect.
Figure 18:
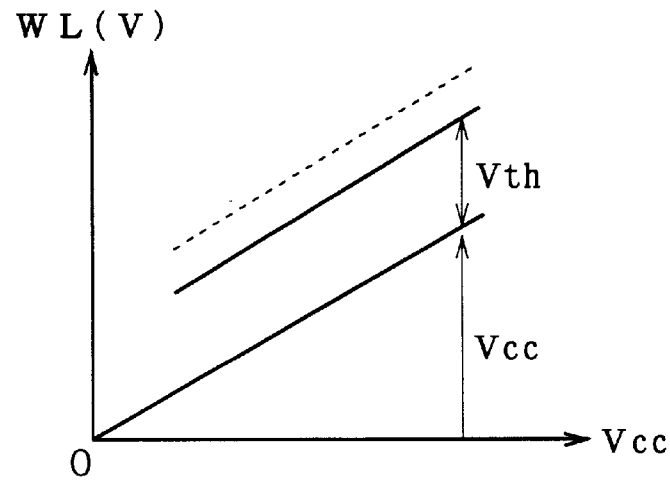
FIG. 18 is a graph showing the relation between the word line and the power-supply potential Vcc.
Figure 19:
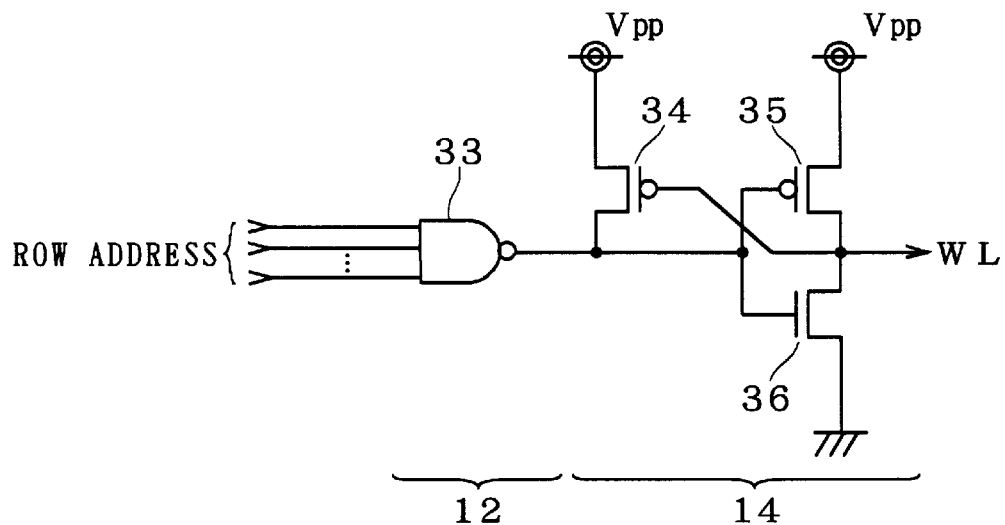
FIG. 19 is a circuit diagram showing a structure of the word driver.
Figure 20:
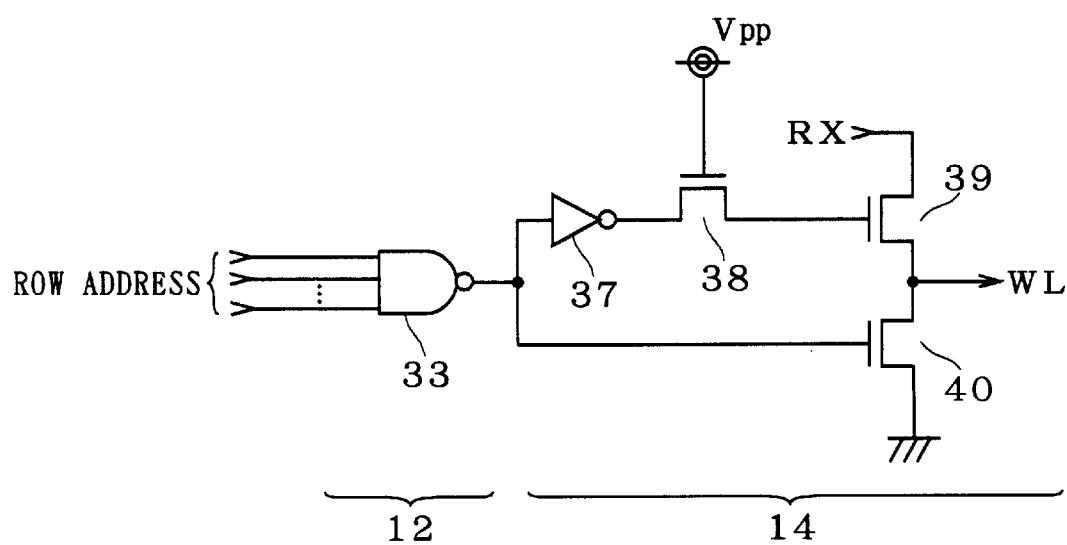
FIG. 20 is a circuit diagram showing another structure of the word driver.
Figure 21:
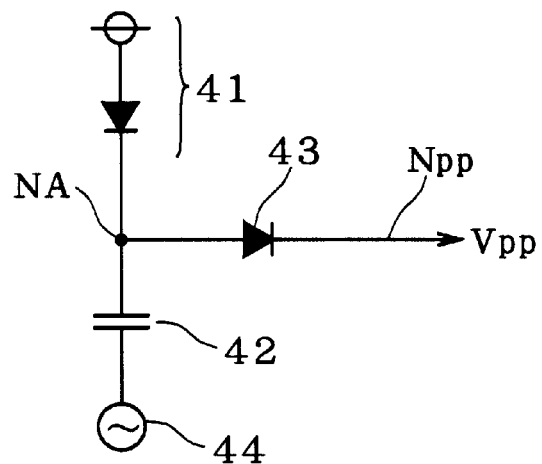
FIG. 21 is a circuit diagram showing the basic principle of a conventional Vpp generating circuit.
Figure 22:
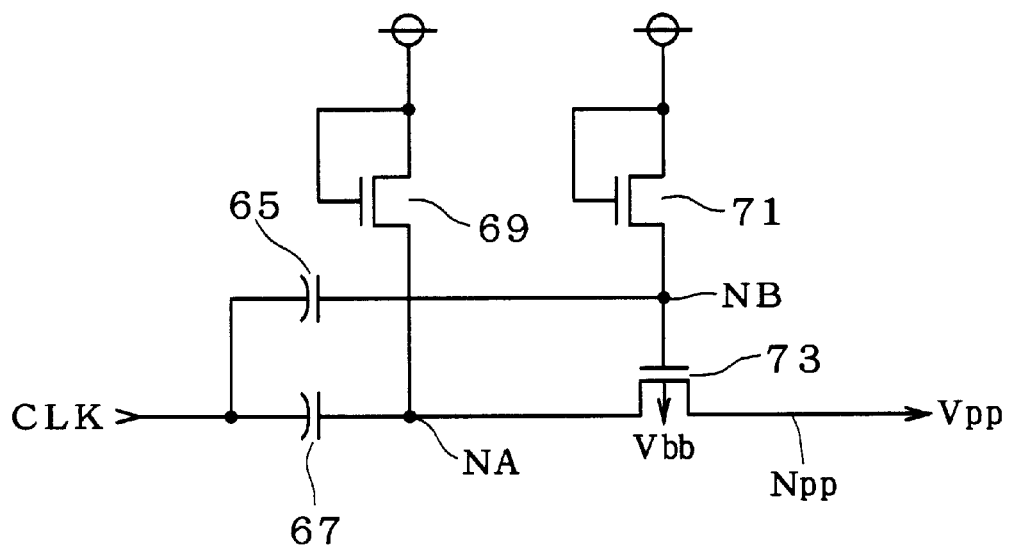
FIG. 22 is a circuit diagram showing a structure of a charge pump circuit.

FIG. 12 is a graph showing a change of the step-up potential Vpp of the step-up potential supply circuit of the third preferred embodiment with respect to a change of the power-supply potential Vcc. In FIG. 12, the line Lf shows the maximum step-up potential Vpp that the step-up potential generating circuit of the third preferred embodiment can generate, the line Lb shows the actually required step-up potential Vpp, and the line Ld shows a change of the power-supply potential Vcc.

In FIG. 12, the potential Vc' is regarded as the first comparison potential according to which the power-supply potential detecting circuit 8 switches the switching signal SS.

In the step-up potential supply circuit of the third preferred embodiment having this structure, the power-supply potential detecting circuit 8 detects the power-supply potential Vcc. When the power-supply potential Vcc is under the first comparison potential Vc', the power-supply potential detecting circuit 8 outputs the switching signal SS at "L" to cause the switch portion 7 to turn on. Then, in addition to the 3Vcc charge pump circuit 5 always in an active state, the 3Vcc charge pump circuit 6 is forced to enter an active state. This provides a charge supply capability (a first charge supply capability) corresponding to a sum of the first and second partial charge supply capabilities, which is twice that by the 3Vcc charge pump circuit 5 in an active state.

Accordingly, even with a power-supply potential Vcc around the potential Va' (the potential at which the step-up potential Vpp coincides with the actually required potential), the relatively large charge supply capability by the 3Vcc charge pump circuits 5 and 6 ensures supply of the 3Vcc step-up potential Vpp to the step-up potential node Npp. Accordingly, a step-up potential Vpp satisfying the actually required potential can be supplied even if the power-supply potential Vcc falls to Va'.

On the other hand, if the power-supply potential Vcc exceeds the first comparison potential Vc', the power-supply potential detecting circuit 8 outputs the switching signal SS at "H" to turn off the switch portion 7. This forces the 3Vcc charge pump circuit 6 into an inactive state, and the step-up potential Vpp is supplied only by the 3Vcc charge pump circuit 5 always in an active state.

Then the step-up potential Vpp (Lf) is below 3Vcc because the step-up potential Vpp is supplied to the step-up potential node Npp with a relatively small charge supply capability (a second charge supply capability) only with the first partial charge supply capability of the 3Vcc charge pump circuit 5. However, no problem is encountered because it is sufficiently above the actually required potential (Lb). This suppresses the charge supply capability to a required minimum, providing the effect of reducing the power consumption.

In addition, since the step-up potential Vpp generated by the step-up potential supply circuit of the third preferred embodiment is 3Vcc, the potential Va' at which the step-up potential Vpp coincides with the actually required potential is smaller than Va in the first and second preferred embodiments. This allows the lower limit of the power-supply potential Vcc with which an appropriate step-up potential Vpp can be supplied to be set smaller than in the first and second preferred embodiments, which enlarges the range of the power-supply potential Vcc which allows supply of the step-up potential Vpp at appropriate levels.

Comparison between the step-up potential supply circuit of the first preferred embodiment and the step-up potential supply circuit of the third preferred embodiment shows that the third preferred embodiment is superior concerning the range of the power supply potential Vcc allowing supply of the step-up potential Vpp at a suitable level, and that the first preferred embodiment is superior concerning the realization of a step-up potential supply circuit in a smaller circuit area with a relatively simple circuit structure.

Although the 3Vcc charge pump circuits 5 and 6 in the third preferred embodiment have the same charge supply capability, the first partial charge supply capability and the second partial charge supply capability may be set to different values considering power consumption and the like.

The idea of the second preferred embodiment may be applied to the third preferred embodiment; three kinds of 3Vcc charge pump circuits may be provided to supply the step-up potential Vpp with three kinds of charge supply capabilities according to a change of the power-supply potential Vcc.

<Others>

The first to third preferred embodiments have shown step-up potential supply circuits which supply the step-up potential Vpp with two or three kinds of charge supply capabilities according to the power-supply level with one or two power-supply potential detecting circuits. However, three or more power-supply detecting circuits may be provided to supply the step-up potential Vpp with four or more kinds of charge supply capabilities by switching the capacitance value in multiple steps.

While the invention has been described in detail, the foregoing description is in all aspects illustrative and not restrictive. It is understood that numerous other modifications and variations can be devised without departing from the scope of the invention.

I claim:

1. A step-up potential supply circuit for supplying a step-up potential from a step-up potential node, comprising:

power-supply potential detecting means for detecting a power-supply potential to output a control signal on the basis of said detected power-supply potential; and step-up potential generating means for stepping up said power supply potential to generate said step-up potential at said step-up potential node;

wherein said step-up potential generating means generates said step-up potential with a charge supply capability determined on the basis of said control signal, and said charge supply capability increases as said power supply potential decreases.

2. The step-up potential supply circuit according to claim 1, wherein said control signal at least includes information indicating a first state in which said power-supply potential is lower than a first comparison potential or a second state in which said power-supply potential is higher than said first comparison potential, and said step-up potential generating means generates said step-up potential with a relatively large, first charge supply capability when said control signal indicates said first state and generates said step-up potential with a relatively small, second charge supply capability when said control signal indicates said second state.

3. The step-up potential supply circuit according to claim 2, wherein said step-up potential generating means comprises, first charge pump means for, in an active state, stepping up said power-supply potential to generate said step-up potential at said step-up potential node with a first partial charge supply capability, and second charge pump means for, in an active state, stepping up said power-supply potential to generate said step-up potential at said step-up potential node with a second partial charge supply capability, wherein said first charge pump means is always in the active state and said second charge pump means enters the active state when said control signal indicates said first state and enters an inactive state when said control signal indicates said second state.

4. The step-up potential supply circuit according to claim 1, wherein said step-up potential includes a potential approximately twice said power-supply potential in magnitude.

5. The step-up potential supply circuit according to claim 1, wherein said step-up potential includes a potential approximately three times said power-supply potential in magnitude.

6. The step-up potential supply circuit according to claim 1, wherein said control signal at least includes information indicating a first state in which said power-supply potential is lower than a first comparison potential, or a second state in which said power-supply potential is higher than said first comparison potential and lower than a second comparison potential, or a third state in which said power-supply potential is higher than said second comparison potential, and said step-up potential generating means generates said step-up potential with a relatively large, first charge supply capability when said control signal indicates said first state, generates said step-up potential with a relatively small, second charge supply capability when said control signal indicates said second state, and generates said step-up potential with a third charge supply capability smaller than said second charge supply capability when said control signal indicates said third state.

7. The step-up potential supply circuit according to claim 6, wherein said step-up potential generating means comprises, first charge pump means for, in an active state, stepping up said power-supply potential to generate said step-up potential at said step-up potential node with a first partial charge supply capability, second charge pump means for, in an active state, stepping up said power-supply potential to generate said step-up potential at said step-up potential node with a second partial charge supply capability, and third charge pump means for, in an active state, stepping up said power-supply potential to generate said step-up potential at said step-up potential node with a third partial charge supply capability, wherein said first charge pump means is always in the active state, said second charge pump means enters the active state when said control signal indicates said first state and enters an inactive state when said control signal indicates said second state or said third state, and said third charge pump means enters the active state when said control signal indicates said first state or said second state and enters an inactive state when said control signal indicates said third state.

8. The step-up potential supply circuit according to claim 7, wherein said control signal includes first and second partial control signals, and said power-supply potential detecting means comprises, first partial power-supply potential detecting means for outputting, to said second charge pump means on the basis of said power-supply potential, said first partial control signal indicating said first state in which said power-supply potential is lower than said first comparison potential, or said second state or said third state in which said power-supply potential is higher than said first comparison potential, and second partial power-supply potential detecting means for outputting, to said third charge pump means on the basis of said power-supply potential, said second partial control signal indicating said first state or said second state in which said power-supply potential is lower than said second comparison potential, or said third state in which said power-supply potential is higher than said second comparison potential.

9. A semiconductor storage device comprising:

a step-up potential supply circuit for supplying a step-up potential from a set-up potential node;

an internal circuit connected to said step-up potential node for operating with said step-up potential as an operation power-supply potential; and a memory cell array which is access-enabled by operation of said internal circuit, wherein said step-up potential supply circuit comprises, power-supply potential detecting means for detecting a power-supply potential to output a control signal on the basis of said detected power supply potential; and step-up potential generating means for stepping up said power-supply potential to generate said step-up potential at said step-up potential node;

wherein said step-up potential generating means generates said step-up potential with a charge supply capability determined on the basis of said control signal, and said charge supply capability increases as said power supply potential decreases.

10. The semiconductor storage device according to claim 9, wherein said memory cell array comprises a plurality of dynamic-type memory cells, and said internal circuit includes a memory cell selecting line control circuit having a memory cell selecting line for selecting a certain number of memory cells in said plurality of memory cells, for setting said memory cell selecting line at said step-up potential in a selected state.

* * * * *